US012575421B2

(12) United States Patent
Kim et al.

(10) Patent No.: US 12,575,421 B2
(45) Date of Patent: Mar. 10, 2026

(54) SEMICONDUCTOR DEVICE COMPRISING DIFFERENT SHIELDING LAYERS TO PROVIDE REDUCED ELECTROMAGNETIC INTERFERENCE AND METHOD FOR MAKING THE SAME

(71) Applicant: STATS ChipPAC Pte. Ltd., Singapore (SG)

(72) Inventors: Heeyoun Kim, Incheon (KR);
Kyowang Koo, Incheon (KR);
Junghoon Kim, Gyeonggi-do (KR);
Youngsang Kim, Gyeonggi-do (KR);
Kyungmoon Kim, Gyeonggi-do (KR)

( * ) Notice: Subject to any disclaimer, the term of this patent is extended or adjusted under 35 U.S.C. 154(b) by 301 days.

(21) Appl. No.: 18/313,316

(22) Filed: May 6, 2023

(65) Prior Publication Data

US 2023/0411304 A1 Dec. 21, 2023

(30) Foreign Application Priority Data

May 18, 2022 (CN) .......................... 202210548061.6

(51) Int. Cl.
*H01L 23/552* (2006.01)
*H01L 21/48* (2006.01)

(52) U.S. Cl.
CPC ........ *H01L 23/552* (2013.01); *H01L 21/4814* (2013.01)

(58) Field of Classification Search
CPC ... H01L 23/552; H01L 21/56; H01L 23/3121; H01L 23/3135; H01L 21/4814; H01L 25/0655; H01L 25/16; H01L 23/66; H01L 2223/6677; H01L 23/293

USPC ......................................................... 257/659
See application file for complete search history.

(56) References Cited

U.S. PATENT DOCUMENTS

| | | | |
|---|---|---|---|
| 8,786,060 | B2 | 7/2014 | Yen et al. |
| 9,461,001 | B1 | 10/2016 | Tsai et al. |
| 10,418,332 | B2 | 9/2019 | Lee et al. |
| 10,510,733 | B2 | 12/2019 | Kumar et al. |

(Continued)

FOREIGN PATENT DOCUMENTS

| | | |
|---|---|---|
| CN | 104766831 A | 7/2015 |
| TW | 201214652 A | 4/2012 |
| TW | 202213635 A | 4/2022 |

*Primary Examiner* — Didarul A Mazumder
(74) *Attorney, Agent, or Firm* — Junhe Law Office, P.C.; Yi Zhang

(57) ABSTRACT

A semiconductor device and a method for making the same are provided. The semiconductor device includes: a substrate including a substrate top surface and a substrate bottom surface; an electronic component mounted on the substrate top surface; a bottom encapsulant disposed on the substrate top surface and encapsulating the electronic component; a top encapsulant disposed on the bottom encapsulant; an internal shielding layer disposed between the bottom encapsulant and the top encapsulant, wherein a projection of the internal shielding layer onto the substrate top surface overlaps with the electronic component, the internal shielding layer has an internal shielding layer lateral surface, and a portion of the internal shielding layer lateral surface is exposed from the bottom encapsulant and the top encapsulant; and an external shielding layer covering the bottom encapsulant and the top encapsulant and contacting with the exposed portion of the internal shielding layer lateral surface.

9 Claims, 20 Drawing Sheets

(56) References Cited

U.S. PATENT DOCUMENTS

| | | | |
|---|---|---|---|
| 2008/0210462 A1* | 9/2008 | Kawagishi | H01L 24/97 |
| | | | 29/841 |
| 2010/0252898 A1* | 10/2010 | Tanaka | B81B 7/0041 |
| | | | 438/51 |
| 2010/0276792 A1* | 11/2010 | Chi | H01L 23/3128 |
| | | | 257/E23.116 |
| 2014/0252595 A1* | 9/2014 | Yen | H01L 23/498 |
| | | | 257/737 |
| 2015/0333017 A1 | 11/2015 | Chang et al. | |
| 2020/0051882 A1 | 2/2020 | Watanabe et al. | |
| 2020/0075502 A1 | 3/2020 | Kim et al. | |
| 2021/0257346 A1 | 8/2021 | Baloglu et al. | |
| 2023/0114892 A1* | 4/2023 | Kim | H01L 21/561 |
| | | | 257/659 |

* cited by examiner

SEMICONDUCTOR DEVICE COMPRISING DIFFERENT SHIELDING LAYERS TO PROVIDE REDUCED ELECTROMAGNETIC INTERFERENCE AND METHOD FOR MAKING THE SAME

TECHNICAL FIELD

The present application generally relates to semiconductor technology, and more particularly, to a semiconductor device and a method for making the same.

BACKGROUND OF THE INVENTION

The semiconductor industry is constantly faced with complex integration challenges as consumers want their electronics to be smaller, faster and higher performance with more and more functionalities packed into a single device. One of the solutions is System-in-Package (SiP). SiP is a functional electronic system or sub-system that includes in a single package two or more heterogeneous semiconductor dice, such as a logic chip, a memory, integrated passive devices (IPD), RF filters, sensors, heat sinks, or antennas. Thus, electromagnetic interference (EMI) may easily occur, and may interrupt, obstruct, or otherwise degrade or limit the effective performance of circuits in the SiP.

Therefore, a need exists for reducing EMI in semiconductor devices.

SUMMARY OF THE INVENTION

An objective of the present application is to provide a semiconductor device with reduced electromagnetic interference.

According to an aspect of embodiments of the present application, a semiconductor device is provided. The semiconductor device may include: a substrate including a substrate top surface and a substrate bottom surface; an electronic component mounted on the substrate top surface; a bottom encapsulant disposed on the substrate top surface and encapsulating the electronic component; a top encapsulant disposed on the bottom encapsulant; an internal shielding layer disposed between the bottom encapsulant and the top encapsulant, wherein a projection of the internal shielding layer onto the substrate top surface overlaps with the electronic component, the internal shielding layer has an internal shielding layer lateral surface, and a portion of the internal shielding layer lateral surface is exposed from the bottom encapsulant and the top encapsulant; and an external shielding layer covering the bottom encapsulant and the top encapsulant and contacting with the exposed portion of the internal shielding layer lateral surface.

According to another aspect of embodiments of the present application, a method for making a semiconductor device is provided. The method may include: providing a package including: a substrate including a substrate top surface and a substrate bottom surface; an electronic component mounted on the substrate top surface; and a bottom encapsulant disposed on the substrate top surface and encapsulating the electronic component; forming an internal shielding layer on the bottom encapsulant, wherein a projection of the internal shielding layer onto the substrate top surface overlaps with the electronic component; forming a top encapsulant on the bottom encapsulant and the internal shielding layer; exposing a portion of a lateral surface of the internal shielding layer from the bottom encapsulant and the top encapsulant; forming an external shielding layer to cover the bottom encapsulant and the top encapsulant and be in contact with the exposed portion of the lateral surface of the internal shielding layer.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

System-in-Package (SiP) devices may integrate therein two or more heterogeneous semiconductor dice or other types of electronic components which require different levels of e electromagnetic shielding. Therefore, it is desired to provide a partial shielding process to meet such requirement.

Figure 1:
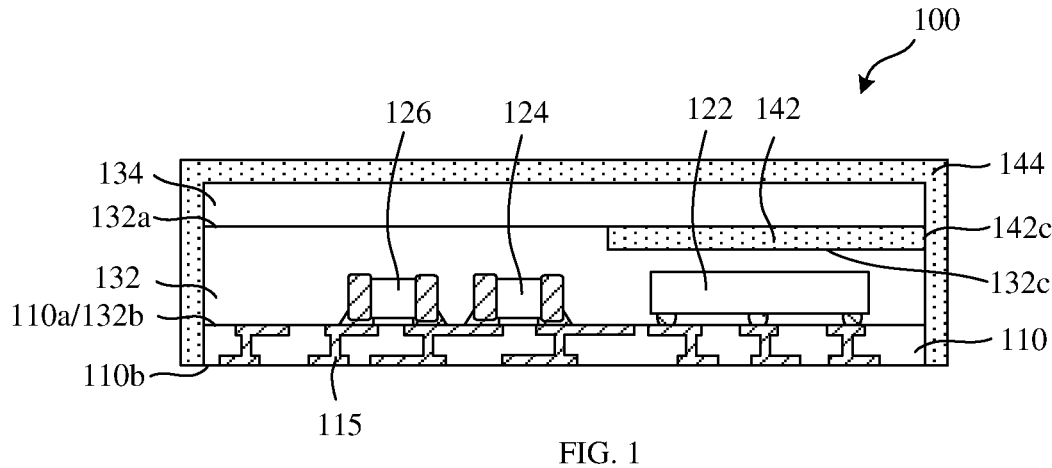
FIG. 1 is a cross-sectional view of a semiconductor device according to an embodiment of the present application.
Figure 2:
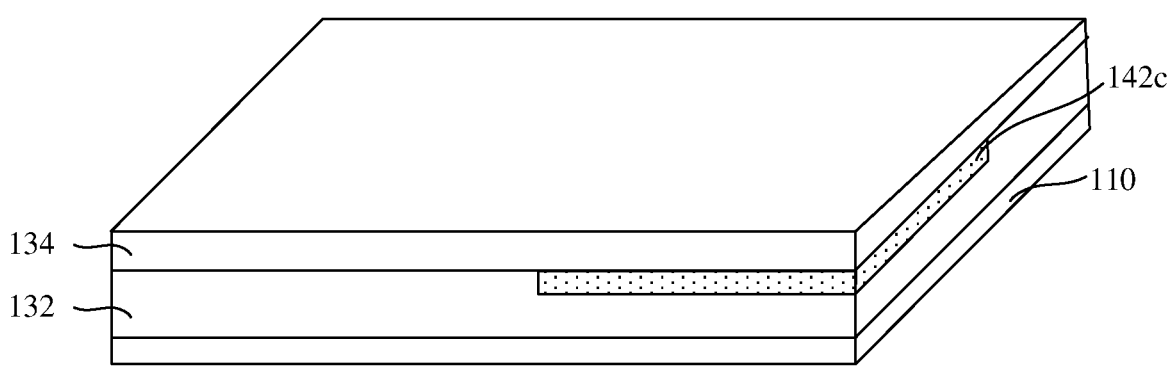
FIG. 2 is a perspective view of a portion of the semiconductor device shown in FIG. 1.

FIG. 1 illustrates a cross-sectional view of a semiconductor device 100 according to an embodiment of the present application. FIG. 2 illustrates a perspective view of a portion of the semiconductor device 100 shown in FIG. 1.

As illustrated in FIG. 1, the semiconductor device 100 includes a substrate 110, an electronic component 122, a bottom encapsulant 132, a top encapsulant 134, an internal shielding layer 142 and an external shielding layer 144.

In particular, the substrate 110 has a substrate top surface 110a and a substrate bottom surface 110b. In some embodiments, the substrate 110 may include a redistribution structure (RDS) 115 having one or more dielectric layers and one or more conductive layers between and through the dielectric layers. The conductive layers may define pads, traces and plugs through which electrical signals or voltages can be distributed horizontally and vertically across the RDS. As shown in the example of FIG. 1, the RDS 115 may include a plurality of top conductive patterns formed on the substrate top surface 110a and a plurality of bottom conductive patterns formed on the substrate bottom surface 110b. In addition, the RDS 115 may further include one or more conductive vias electrically connecting at least one of the top conductive patterns with at least one of the bottom conductive patterns. The RDS 115 may include one or more of Al, Cu, Sn, Ni, Au, Ag, or any other suitable electrically conductive materials. In a case where the substrate 110 is a single layer, the conductive vias may penetrate between the substrate top surface 110a and the substrate bottom surface 110b to directly connect the top conductive patterns with the bottom conductive patterns respectively. In a case where the substrate 110 has multiple layers, the conductive vias may be configured to partially penetrate between the substrate top surface 110a and the substrate bottom surface 110b to connect the top conductive patterns and the bottom conductive patterns using additional wire patterns formed within the substrate 110. It could be understood that, the top conductive patterns, the bottom conductive patterns and the conductive vias may be implemented in various structures and types, but aspects of the present application are not limited thereto.

A plurality of electronic components 122, 124 and 126 are mounted on the substrate top surface 110a. The electronic components 122, 124 and 126 may include any of a variety of types of semiconductor dies, semiconductor packages, or discrete devices. For example, the electronic components 122, 124 and 126 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc. The electronic components 122, 124 and 126 may include one or more passive electrical components such as resistors, capacitors, inductors, etc. The electronic components 122, 124 and 126 can be mounted on the substrate top surface 110a using any suitable surface mounting techniques.

In the present application, the electronic component 122 may contain devices or circuits that are susceptible to or generate electromagnetic interference (EMI), radio frequency interference (RFI), harmonic distortion, and inter-device interference. In some cases, the electronic component 122 may include any component that is configured to provide several mobile functionalities and capabilities, including but not limited to, positioning functionality, wireless connectivity functionality (e.g., wireless communication) and/or cellular connectivity functionality (e.g., cellular communication). In some cases, the electronic component 122 may be configured to provide a radio frequency front end (RFFE) functionality. For example, the electronic component 122 may include, but not limited to, a power amplifier, a filter, a switch, a low noise amplifier (LNA), a tuner, a multiplexer, etc. In FIG. 1, the electronic component 122 is shown as a semiconductor die. The semiconductor die 122 is formed in a flip chip type and is mounted such that conductive bumps of the semiconductor die 122 are welded to some of the RDS 115 of the substrate 110. In other embodiments, the electronic component 122 may include bond pads and may be connected to the RDS 115 by wire bonding. The present application does not limit the connection relationship between the electronic component 122 and the RDS 115 to that disclosed herein.

The bottom encapsulant 132 may be disposed on the substrate top surface 110a and encapsulate the electronic components 122, 124 and 126. The bottom encapsulant 132 may be made of polymer composite material, such as epoxy resin with filler, epoxy acrylate with filler, or polymer with proper filler, but the scope of this application is not limited thereto. The bottom encapsulant 132 may protect the electronic component 122, 124 and 126 from external environment. The bottom encapsulant 132 is non-conductive, provides structural support, and environmentally protects the electronic components from external elements and contaminants.

As shown in FIG. 1, the bottom encapsulant 132 includes a top surface 132a and a bottom surface 132b, and the top surface 132a includes a concave portion 132c. The internal shielding layer 142 is disposed in the concave portion 132c of the top surface 132a. The internal shielding layer 142 may be one or more layers of Al, Cu, Sn, Ni, Au, Ag, or other suitable conductive material. Alternatively, the internal shielding layer 142 may be carbonyl iron, stainless steel, nickel silver, low-carbon steel, silicon-iron steel, foil, conductive resin, carbon-black, aluminum flake, or other metals and composites capable of reducing the effects of EMI, RFI, and other inter-device interference. A projection of the internal shielding layer 142 onto the substrate top surface overlaps with the electronic component 122, and thus the internal shielding layer 142 can shield EMI or other interferences induced to (or generated by) the electronic component 122.

The top encapsulant 134 is disposed on the bottom encapsulant 132. The top encapsulant 134 may be made of the same material or a different material as the bottom encapsulant 132. In some embodiments, the top encapsulant 134 may include an epoxy molding compound (EMC) filled with one or more high-k dielectric materials (such as, $Si_3N_4$, $Al_2O_3$, etc.). The high-k fillers can improve thermal conductivity of the top encapsulant 134.

Referring to the FIG. 2, a perspective view of the semiconductor device 100 is illustrated, in which the external shielding layer 144 is omitted to show the internal shielding layer 142 more clear. As shown in FIG. 2, a portion 142c of the lateral surface of the internal shielding layer 142 is exposed from the bottom encapsulant 132 and the top encapsulant 134. The portion 142c of the lateral surface of the internal shielding layer 142 may be in contact with the external shielding layer 144 as shown in FIG. 1.

The external shielding layer 144 covers the top and lateral surfaces of the top encapsulant 134, the lateral surface of the bottom encapsulant 132, and the lateral surface of the substrate 110. The external shielding layer 144 may be made of the same material or a different material as the internal shielding layer 142, and can also shield EMI or other interferences induced to (or generated by) the electronic components 122, 124 and 126. Thus, the combination of the internal shielding layer 142 and the external shielding layer 144 can significantly reduce EMI or other interferences in the semiconductor device 100.

Referring to FIGS. 3A-3G, cross-sectional views illustrating a method of making a semiconductor device are shown. For example, the method may be used to make the semiconductor device shown in FIG. 1.

Figures 3A, 3B:
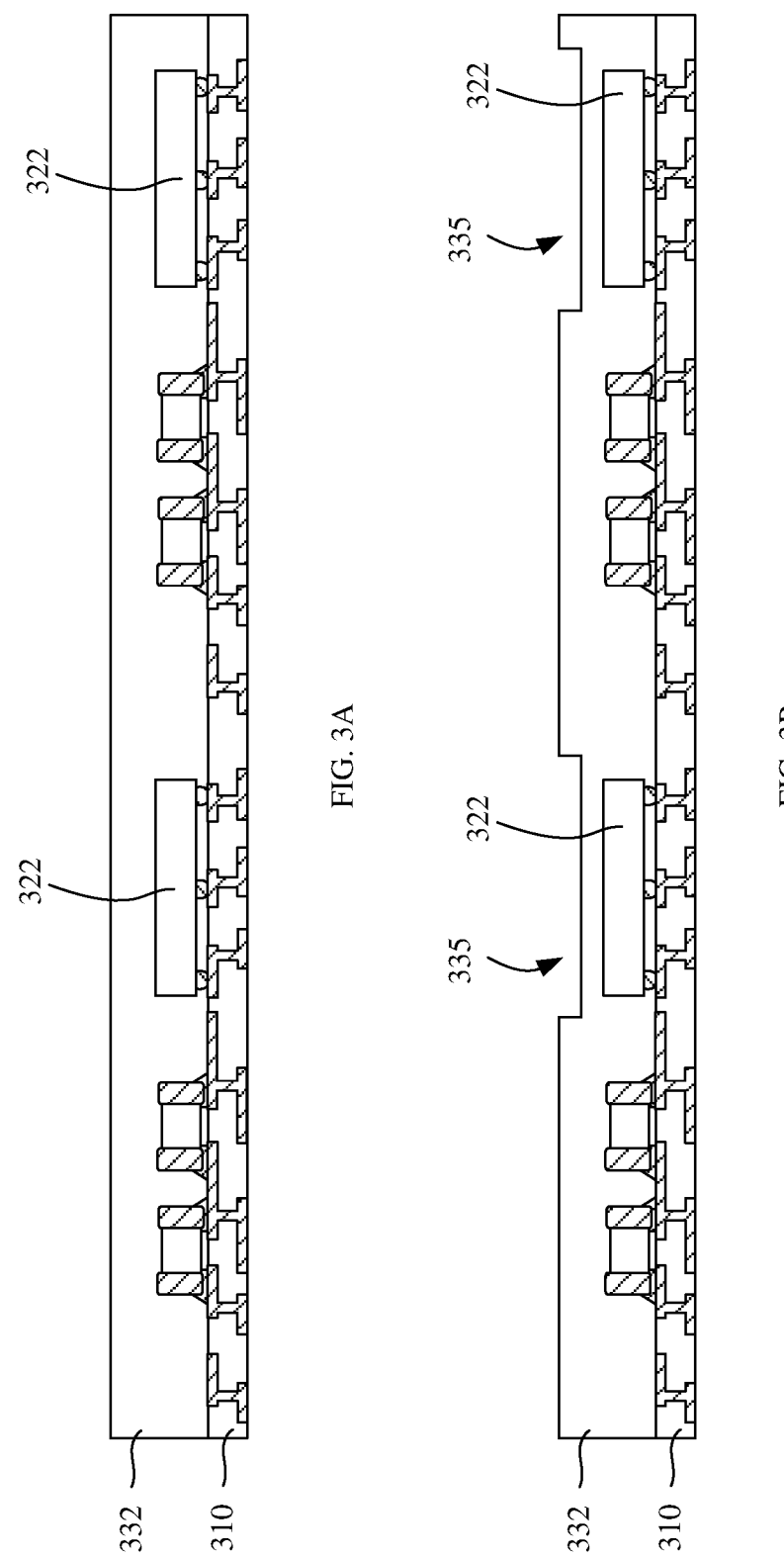
FIGS. 3A to 3G are cross-sectional views illustrating various steps of a method for making a semiconductor device according to an embodiment of the present application.

As shown in FIG. 3A, a package is provided. The package includes a substrate 310, an electronic component 322, and a bottom encapsulant 332. The electronic component 322 is mounted on the top surface of the substrate 310, and the bottom encapsulant 332 is disposed on the top surface of the substrate 310 and encapsulates the electronic component 322. The substrate 310, the electronic component 322 and the bottom encapsulant 332 are similar as the substrate 110, the electronic component 122 and the bottom encapsulant 132 shown in FIG. 1, respectively, and will not be described in detail herein.

Referring to FIG. 3A, a plurality of electronic components 322 can be formed on the substrate 310. The plurality of electronic components 322 can be isolated from each other by singulation channels (not shown), and the singulation channels can provide cutting areas to singulate the substrate 110 into individual semiconductor devices.

As shown in FIG. 3B, a portion of a thickness of the bottom encapsulant 332 is removed or reduced to form a cavity 335 in the bottom encapsulant 332, without exposing the electronic component 322. The cavity 335 can occupy a space at least partially above the electronic component 322.

In some embodiments, a laser ablation process may be employed to form the cavity 335 in the bottom encapsulant 332. The laser ablation process can be controlled by computer-aided design (CAD) data, and therefore the size and depth of the cavity 335 can be accurately controlled. In some other embodiments, the cavity 335 may be formed by an etching process, or any other process known in the art so long as the encapsulant material can be removed.

Figures 3C, 3D:
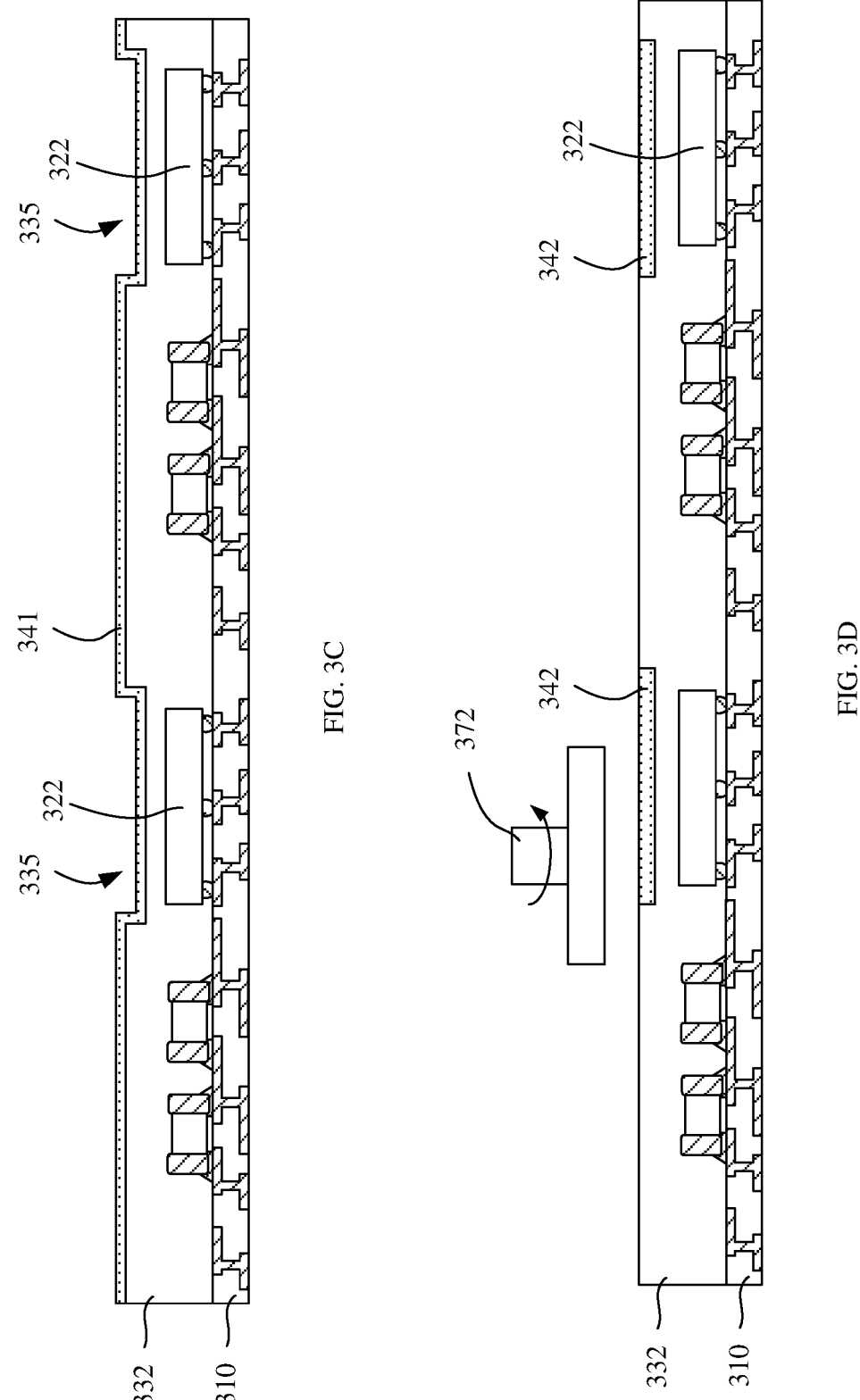

As shown in FIG. 3C, a shielding material 341 is formed on the bottom encapsulant 332 and in the cavity 335. The shielding material 341 may be formed by spray coating, plating, sputtering, or any other suitable metal deposition process. The shielding material 341 may be formed from copper, aluminum, iron, or any other suitable material for EMI shielding.

Referring to FIG. 3C and FIG. 3D, the shielding material 341 and the bottom encapsulant 332 are grinded to remove the shielding material 341 outside the cavity 335, and the shielding material 341 remaining in the cavity 335 may form the internal shielding layer 342. As the cavity 335 is at a location above the electronic component 322, a projection of the internal shielding layer 342 onto the substrate top surface can overlap with the electronic component 322.

For example, a portion of the shielding material 341 and a portion of the bottom encapsulant 332 are removed by a grinder 372. A etch stop monitoring mechanism may be employed to avoid significant over-etching of the bottom encapsulant 332. The grinder 372 can also planarize the top surface of the bottom encapsulant 332 and the top surface of the internal shielding layer 342.

Figures 3E, 3F:
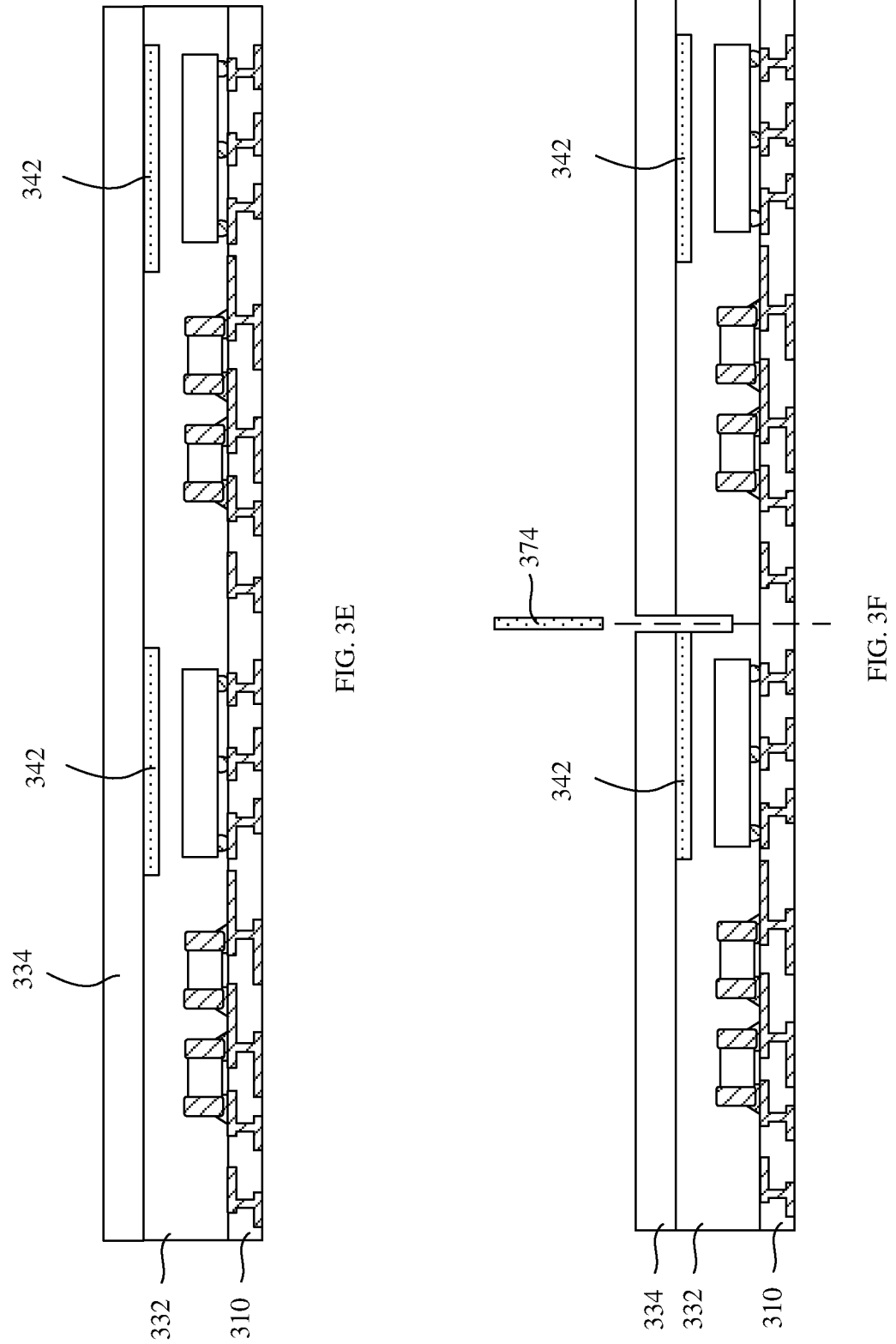

Afterwards, as shown in FIG. 3E, a top encapsulant 334 is formed on the bottom encapsulant 332 and the internal shielding layer 342.

For example, the top encapsulant 334 can be formed on the bottom encapsulant 332 and the internal shielding layer 342 using a paste printing, compressive molding, transfer molding, liquid encapsulant molding, vacuum lamination, spin coating, or other suitable process. The top encapsulant 334 may be made of polymer composite material, such as epoxy resin with filler, epoxy acrylate with filler, or polymer with proper filler, but the scope of this application is not limited thereto. For example, the top encapsulant 334 may include an epoxy molding compound filled with one or more high-k dielectric materials. The high-k fillers can improve thermal conductivity of the top encapsulant 334.

Afterwards, as shown in FIG. 3F, the substrate 310 is singulated into individual devices, and a portion of a lateral surface of the internal shielding layer 342 is exposed from the bottom encapsulant 332 and the top encapsulant 334.

For example, as shown in FIG. 3F, the substrate 310 can be singulated into individual devices through singulation channels using a saw blade 374. In some other examples, a laser cutting tool can also be used to singulate the substrate 310.

Figure 3G:
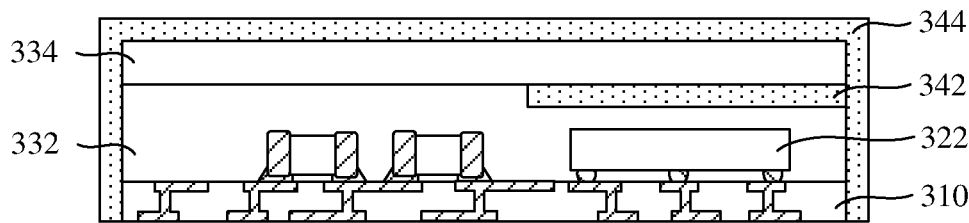

As shown in FIG. 3G, an external shielding layer 344 is formed to cover the bottom encapsulant 332 and the top encapsulant 334 and be in contact with the internal shielding layer 342. In this way, the external shielding layer 344 and the internal shielding layer 342 are electrically coupled with each other.

The external shielding layer 344 may be made of the same material or a different material as the internal shielding layer 342, and may be formed by spray coating, plating, sputtering, or any other suitable metal deposition process. The external shielding layer 344 may be a conformal shield that follows the shapes and/or contours of the top encapsulant 334, the bottom encapsulant 332 and the substrate 310. That is, the external shielding layer 344 covers the top and lateral surfaces of the top encapsulant 334, the lateral surface of the bottom encapsulant 332, and the lateral surface of the substrate 310. As a portion of the lateral surface of the internal shielding layer 342 is exposed from the bottom encapsulant 332 and the top encapsulant 334, the external shielding layer 344 may also contacts with the internal shielding layer 342.

Referring to FIGS. 4A-4D, cross-sectional views illustrating a method of making a semiconductor device are shown. For example, the method can also be used to make the semiconductor device shown in FIG. 1.

Figures 4A, 4B:
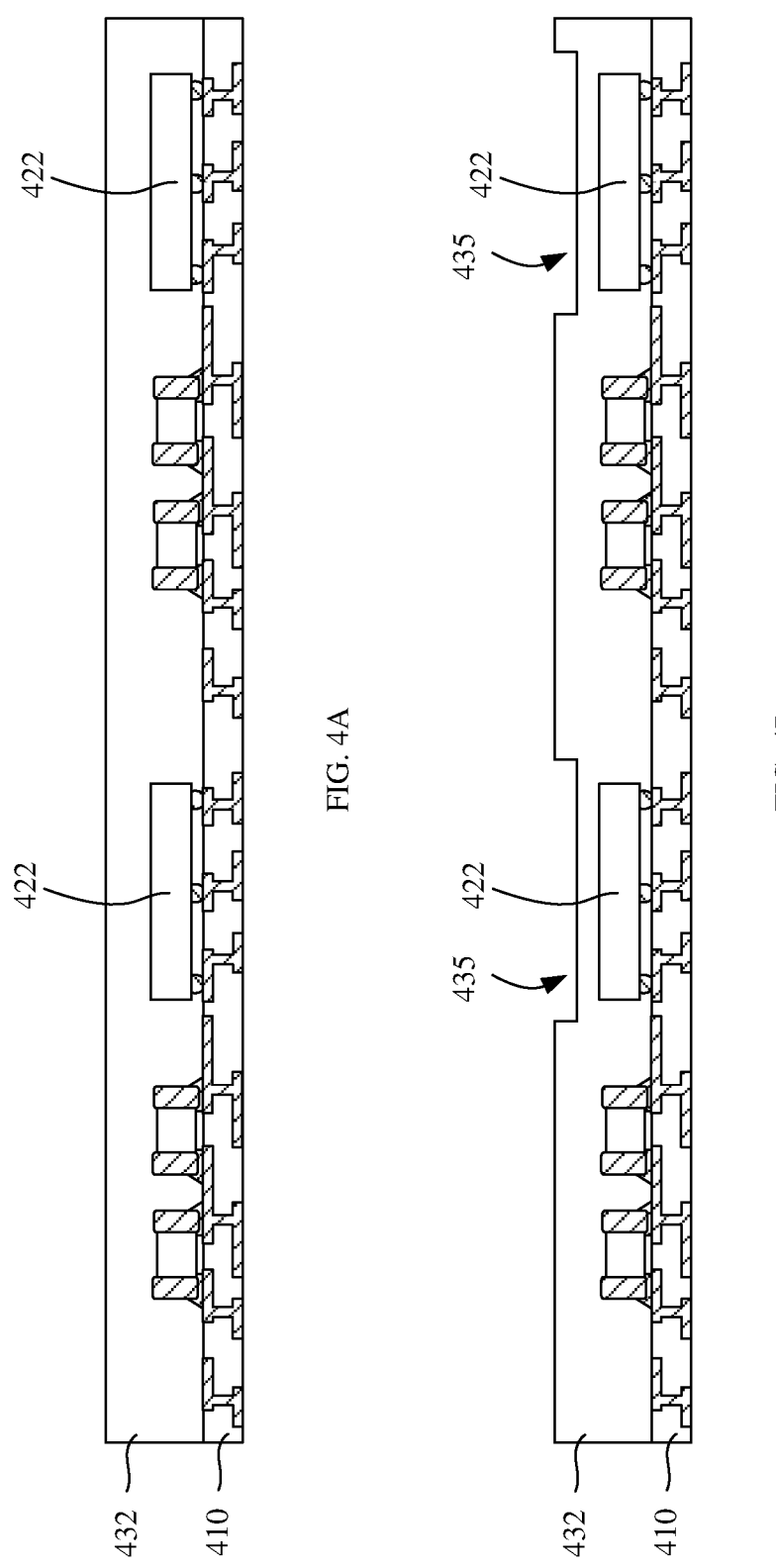
FIGS. 4A to 4D are cross-sectional views illustrating various steps of a method for making a semiconductor device according to another embodiment of the present application.

As shown in FIG. 4A, a package is provided. The package includes a substrate 410, an electronic component 422, and a bottom encapsulant 432. The electronic component 422 is mounted on the top surface of the substrate 410, and the bottom encapsulant 432 is disposed on the top surface of the substrate 410 and encapsulates the electronic component 422.

Afterwards, as shown in FIG. 4B, a portion of a thickness of the bottom encapsulant 432 is removed or reduced to form a cavity 435 in the bottom encapsulant 432. The cavity 435 can occupy a space at least partially above the electronic component 422.

Figures 4C, 4D:
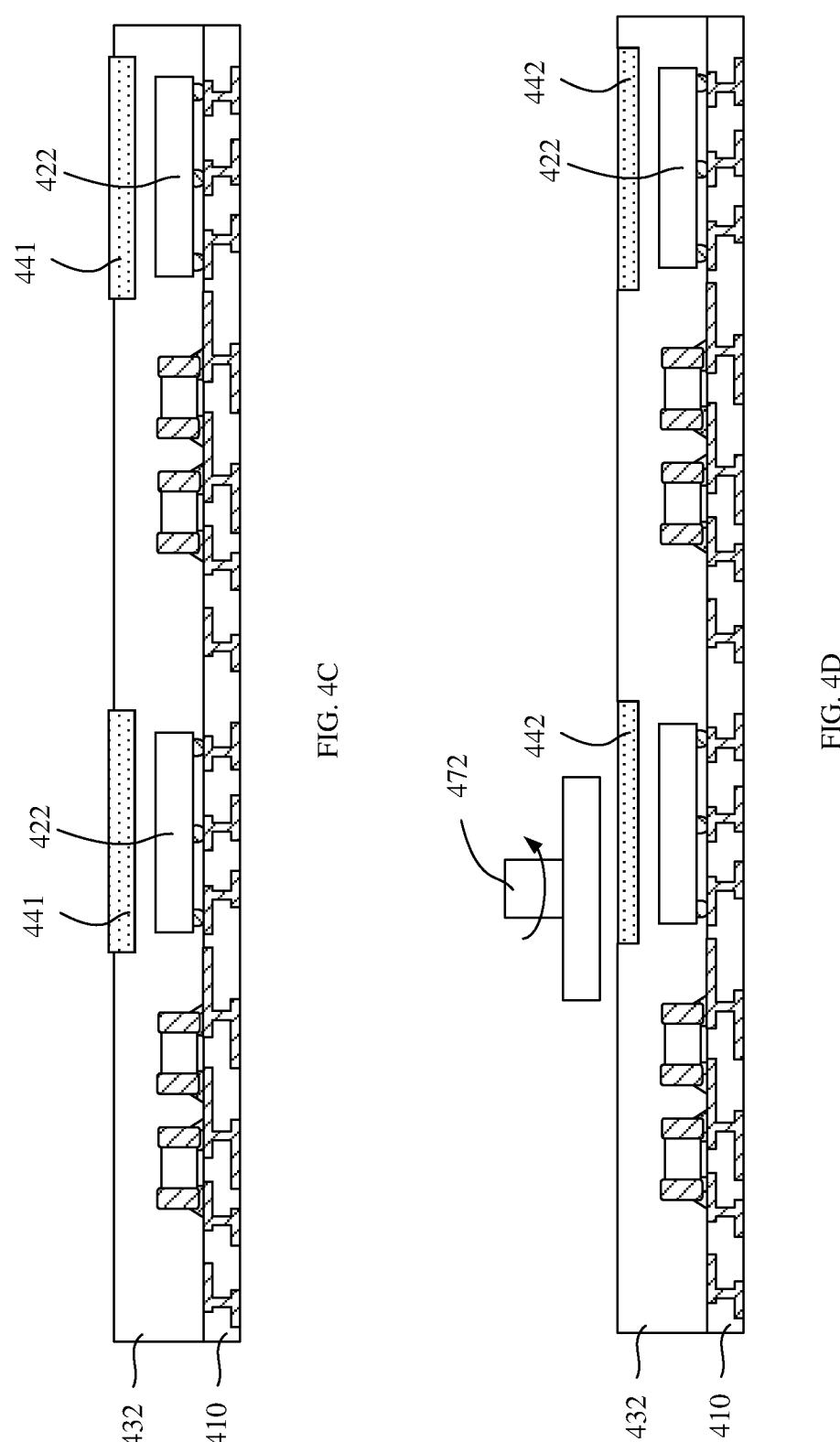

Afterwards, as shown in FIG. 4C, a shielding material 441 is dispensed in the cavity 435 of the bottom encapsulant 432. For example, the shielding material can be dispensed using a dispensing apparatus, which can dispense a specific amount of material to specific positions as desired. In this example, the dispensing apparatus can dispense copper, aluminum, iron, or any other suitable material into the cavity 435 shown in FIG. 4B.

Afterwards, referring to FIG. 4C and FIG. 4D, the shielding material 441 and the bottom encapsulant 432 are grinded to form the internal shielding layer 442 in the cavity.

For example, a portion of the shielding material 441 and a portion of the bottom encapsulant 432 are removed by a grinder 472. The grinder 472 can also planarize the top surface of the bottom encapsulant 432 and the top surface of the internal shielding layer 442.

The structure shown in FIG. 4D is similar to the structure shown in FIG. 3D, and accordingly subsequent processes similar to FIG. 3E-3G may be performed on the structure shown in FIG. 4D to form the semiconductor device of the present application, and will not be elaborated herein.

Figure 5:
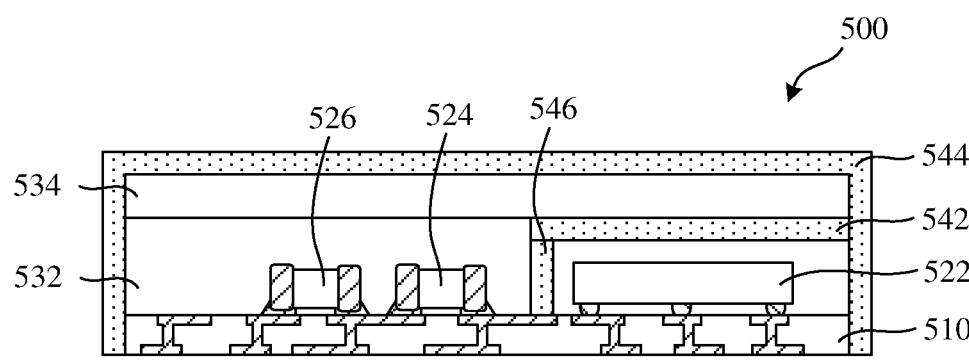
FIG. 5 is a cross-sectional view of a semiconductor device according to another embodiment of the present application.

FIG. 5 illustrates a cross-sectional view of another semiconductor device 500 according to another embodiment of the present application.

As shown in FIG. 5, the semiconductor device 500 includes a substrate 510, an electronic component 522, a bottom encapsulant 532, a top encapsulant 534, an internal shielding layer 542 and an external shielding layer 544. The electronic component 522 is mounted on the top surface of the substrate 510, the bottom encapsulant 532 is disposed on the top surface of the substrate 510 and encapsulates the electronic component 522, and the top encapsulant 534 is disposed on the bottom encapsulant 532. The internal shielding layer 542 is disposed between the bottom encapsulant 532 and the top encapsulant 534, and a projection of the internal shielding layer 542 onto the top surface of the substrate 510 overlaps with the electronic component 522. As shown in FIG. 5, the top surface of the bottom encapsulant 532 includes a concave portion, and the internal shielding layer 542 is disposed in the concave portion of the top surface of the bottom encapsulant 532. A portion of the lateral surface of the internal shielding layer 542 is exposed from the bottom encapsulant 532 and the top encapsulant 534. The external shielding layer 544 covers the bottom encapsulant 532 and the top encapsulant 534 and is in contact with the portion of the lateral surface of the internal shielding layer 542.

Referring to FIG. 5, the semiconductor device 500 further includes a conductive fence 546. The conductive fence 546 is disposed on the top surface of the substrate 510 and in contact with the internal shielding layer 542.

For example, the conductive fence 546 may be bonded to a conductive layer on the substrate 510 with a conductive paste. The conductive fence 546 can be one or more layers of Al, Cu, Sn, Ni, Au, Ag, or other suitable conductive material. Alternatively, the conductive fence 546 can be carbonyl iron, stainless steel, nickel silver, low-carbon steel, silicon-iron steel, foil, conductive resin, carbon-black, aluminum flake, or other metals and composites capable of reducing the effects of EMI, RFI, and other inter-device interference. The conductive fence 546 may extend above the substrate 510 and provide physical and electrical isolation between the electronic component 522 and other electronic components (for example, electronic components 524 and 526 shown in FIG. 5). The conductive fence 546 can further shield EMI or other interferences induced to (or generated by) the electronic component 522 from laterals sides of the electronic component 522. It can be understood that the conductive fence 546 may surround the electronic component 522 from various lateral sides thereof.

Figures 6A, 6B:
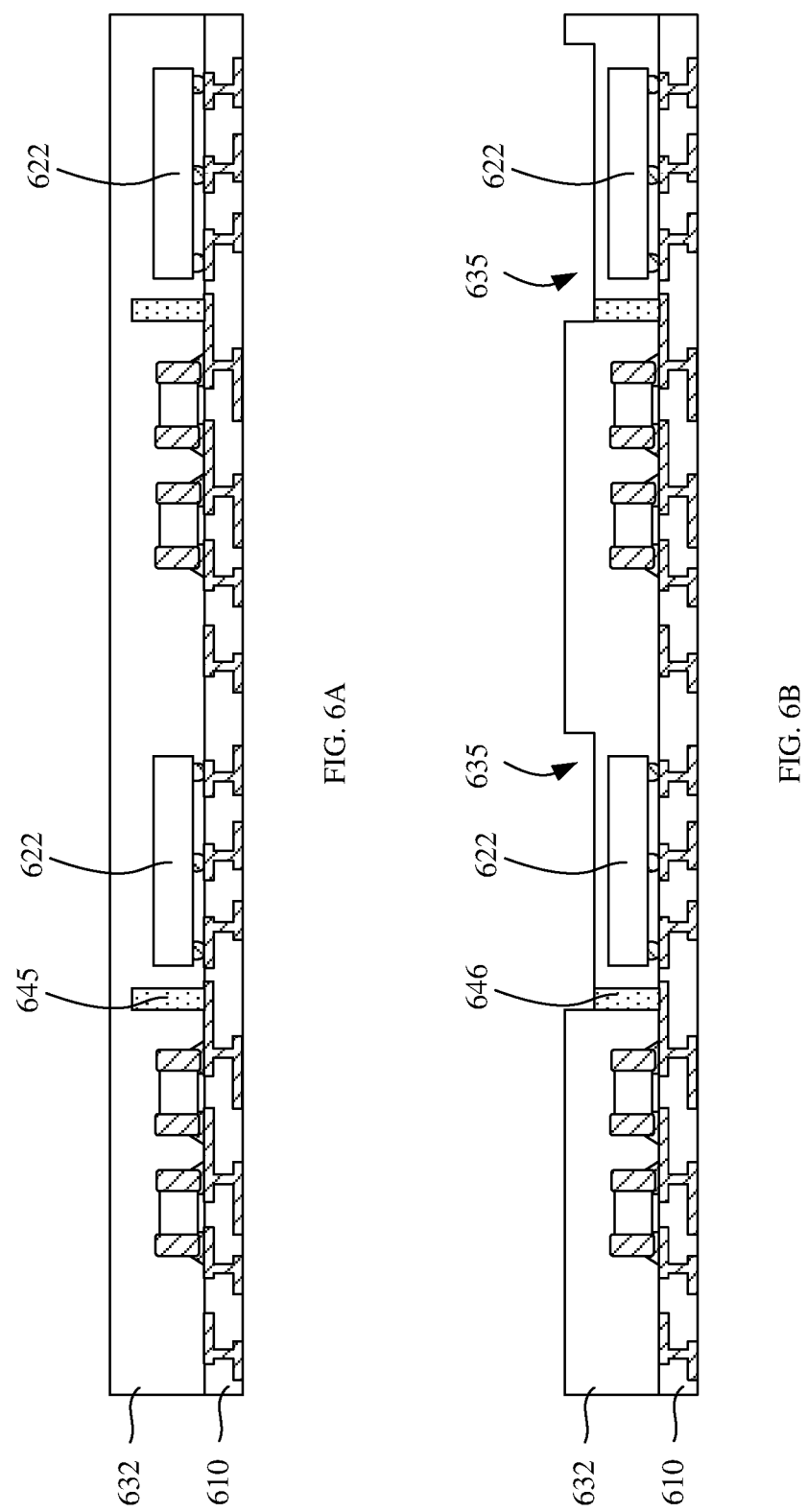
FIGS. 6A to 6B are cross-sectional views illustrating various steps of a method for making a semiconductor device according to another embodiment of the present application.

Referring to FIGS. 6A-6B, cross-sectional views illustrating a method of making a semiconductor device are shown. For example, the method can also be used to make the semiconductor device shown in FIG. 5.

As shown in FIG. 6A, a package is provided. The package includes a substrate 610, an electronic component 622, and a bottom encapsulant 632. The electronic component 622 is mounted on the top surface of the substrate 610, and the bottom encapsulant 632 is disposed on the top surface of the substrate 610 and encapsulates the electronic component 622. Referring to FIG. 6A, the package further includes a metal wall 645. The metal wall 645 can be bonded to a conductive layer on the substrate 610 with a conductive paste.

Afterwards, as shown in FIG. 6B, a portion of a thickness of the bottom encapsulant 632 is reduced to form a cavity 635 in the bottom encapsulant 632. The cavity 635 is at a location above the electronic component 622.

For example, a laser ablation process may be employed to form the cavity 635 in the bottom encapsulant 632. The laser ablation process can remove a portion of the bottom encapsulant 632 and a portion of the metal wall 645, so as to form the cavity 635 in the bottom encapsulant 632. The metal wall 645 left in the bottom encapsulant 632 forms a conductive fence 646, and a top surface of the conductive fence 646 is exposed from the bottom encapsulant 632.

The structure shown in FIG. 6B is similar to the structure shown in FIG. 3B, and accordingly subsequent processes similar to FIG. 3C-3G may be performed on the structure shown in FIG. 6B, and will not be elaborated herein.

Figures 7A, 7B:
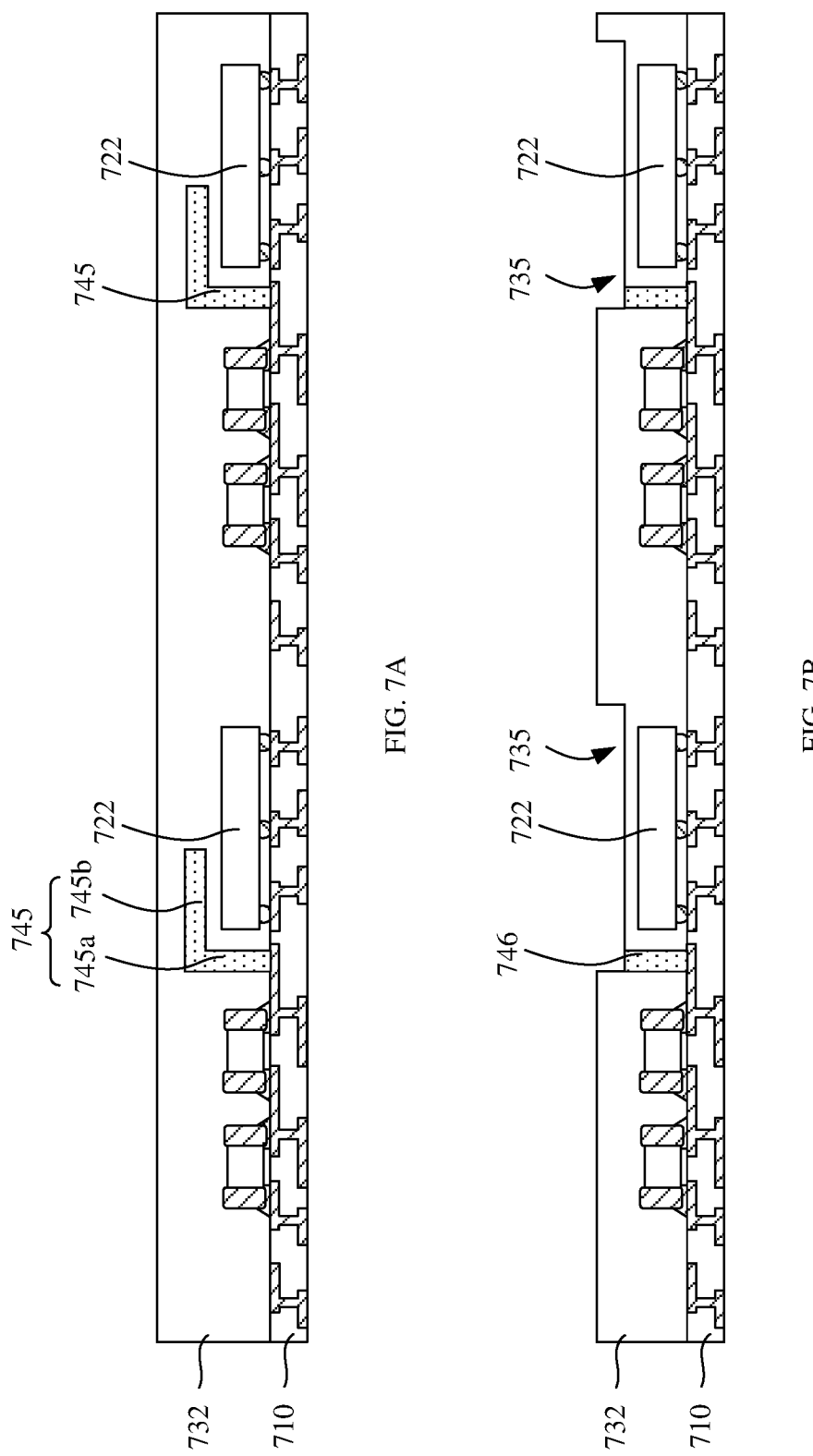
FIGS. 7A to 7B are cross-sectional views illustrating various steps of a method for making a semiconductor device according to another embodiment of the present application.

Referring to FIGS. 7A-7B, cross-sectional views illustrating a method of making a semiconductor device are shown. For example, the method can also be used to make the semiconductor device shown in FIG. 5.

As shown in FIG. 7A, a package is provided. The package includes a substrate 710, an electronic component 722, and a bottom encapsulant 732. The electronic component 722 is mounted on the top surface of the substrate 710, and the bottom encapsulant 732 is disposed on the top surface of the substrate 710 and encapsulates the electronic component 722. Referring to FIG. 7A, the package further includes a metal can 745. The metal can 745 may include a vertical portion 745a and a horizontal portion 745b. The metal can 745 may be a metal sheet that are pre-formed with a desired shape and then connected to the substrate 710 with solder or some other material.

Afterwards, as shown in FIG. 7B, a portion of a thickness of the bottom encapsulant 732 is reduced to form a cavity 735 in the bottom encapsulant 732. The cavity 735 is at a location above the electronic component 722.

For example, a laser ablation process may be employed to form the cavity 735 in the bottom encapsulant 732. The laser ablation process can remove a portion of the bottom encapsulant 732, the horizontal portion 745b of the metal can 745, and a portion of the vertical portion 745a of the metal can 745, so as to form the cavity 735 in the bottom encapsulant 732. The remaining portion of the vertical portion 745a of the metal can 745 forms the conductive fence 746.

The structure shown in FIG. 7B is similar to the structure shown in FIG. 3B, and accordingly subsequent processes similar to FIG. 3C-3G may be performed on the structure shown in FIG. 7B, and will not be elaborated herein.

Figure 8:
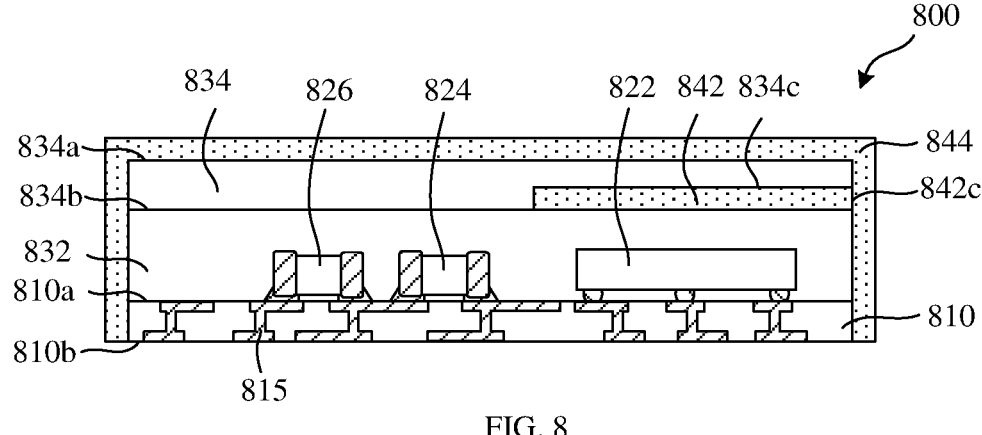
FIG. 8 is a cross-sectional view of a semiconductor device according to another embodiment of the present application.
Figure 9:
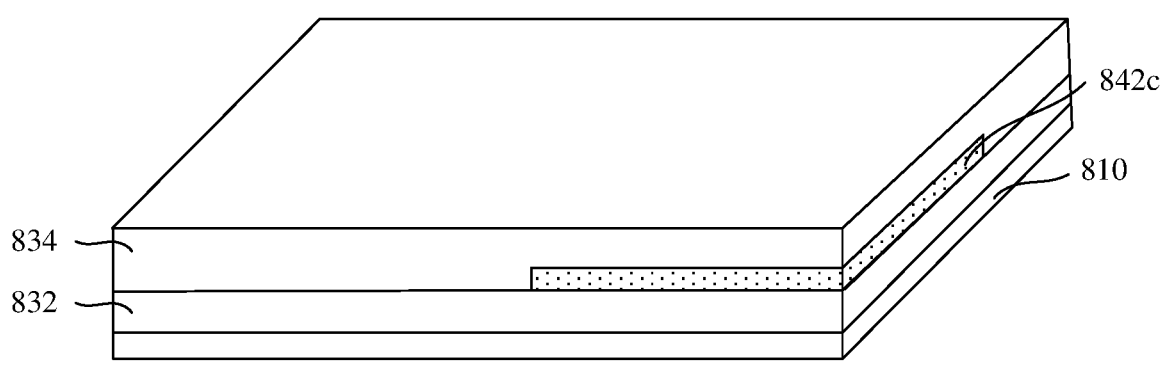
FIG. 9 is a perspective view of a portion of the semiconductor device shown in FIG. 8.

FIG. 8 illustrates a cross-sectional view of another semiconductor device 800 according to an embodiment of present application. FIG. 9 illustrates a perspective view of a portion of the semiconductor device 800 shown in FIG. 8.

In particular, a substrate 810 has a substrate top surface 810a and a substrate bottom surface 810b. In some embodiments, the substrate 810 may include a redistribution structure (RDS) 815 having one or more dielectric layers and one or more conductive layers between and through the dielectric layers. A plurality of electronic components 822, 824 and 826 are mounted on the substrate top surface 810a. The electronic component 822 may contain devices or circuits that are susceptible to or generate EMI, RFI, harmonic distortion, and inter-device interference. A bottom encapsulant 832 may be disposed on the substrate top surface 810a and encapsulating the electronic components 822, 824 and 826. A top encapsulant 834 is disposed on the bottom encapsulant 832. The top encapsulant 834 may be the same material or a different material as the bottom encapsulant 832.

As shown in FIG. 8, the top encapsulant 834 includes a top surface 834a and a bottom surface 834b, and the bottom surface 834b includes a concave portion 834c. An internal shielding layer 842 is disposed in the concave portion 834c of the bottom surface 834b. The internal shielding layer 842 may be one or more layers of Al, Cu, Sn, Ni, Au, Ag, or other suitable conductive material. Alternatively, the internal shielding layer 842 may be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference. A projection of the internal shielding layer 842 onto the substrate top surface 810a overlaps with the electronic component 822, and thus the internal shielding layer 842 can shield EMI or other interferences induced to (or generated by) the electronic component 822. An external shielding layer 844 covers the top and lateral surfaces of the top encapsulant 834, the lateral surface of the bottom encapsulant 832, and the lateral surface of the substrate 810.

Referring to the FIG. 9, a perspective view of the semiconductor device 800 is illustrated, in which the external shielding layer 844 is omitted to show the internal shielding layer 842 more clear. As shown in FIG. 9, a portion 842c of the lateral surface of the internal shielding layer 842 is exposed from the bottom encapsulant 832 and the top encapsulant 834. The portion 842c of the lateral surface of the internal shielding layer 842 may be in contact with the external shielding layer 844 as shown in FIG. 8.

Referring to FIGS. 10A-10H, cross-sectional views illustrating a method of making a semiconductor device are shown. For example, the method can also be used to make the semiconductor device shown in FIG. 8.

Figures 10A, 10B:
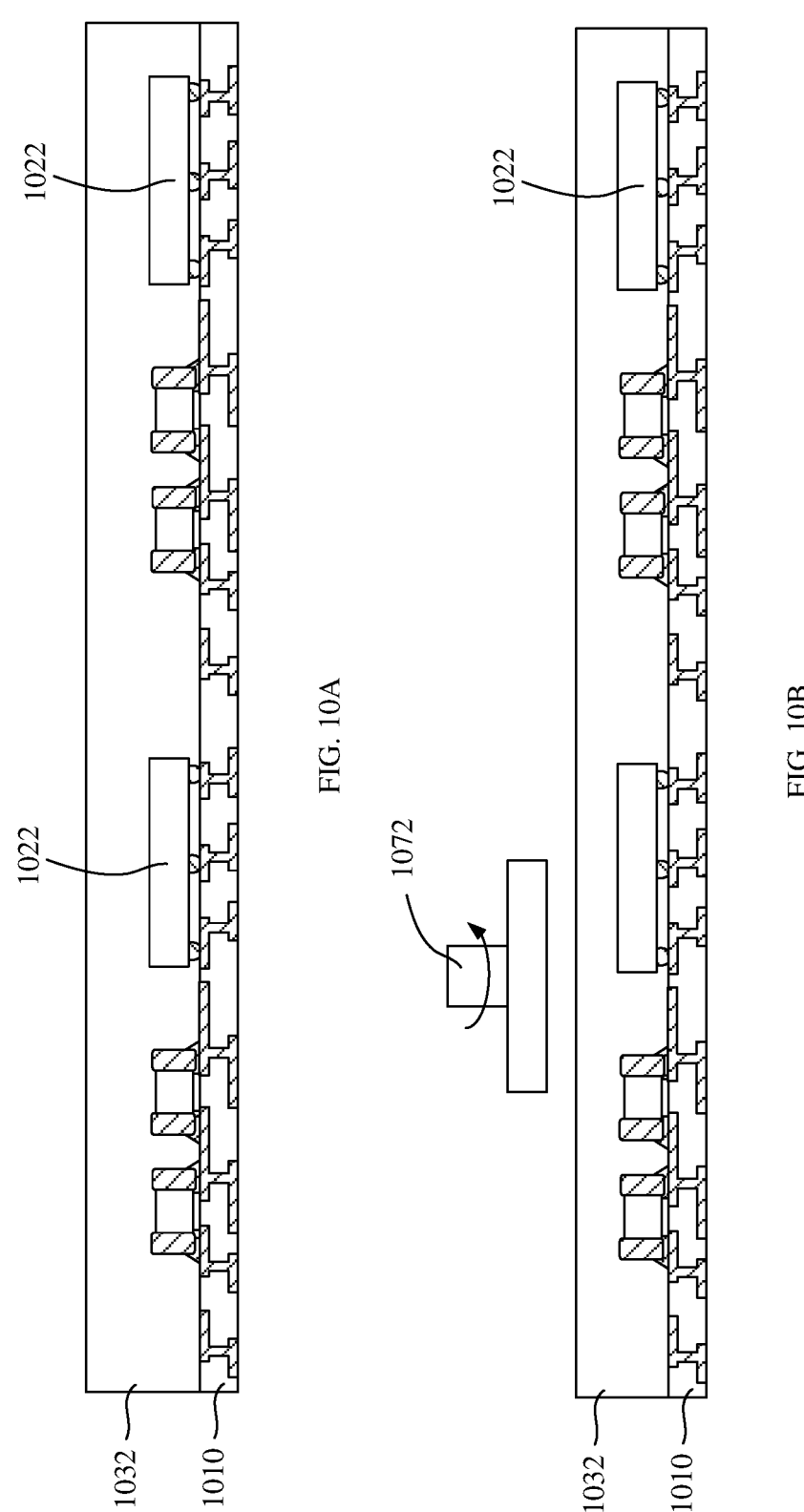
FIGS. 10A to 10H are cross-sectional views illustrating various steps of a method for making a semiconductor device according to an embodiment of the present application.

As shown in FIG. 10A, a package is provided. The package includes a substrate 1010, an electronic component 1022, and a bottom encapsulant 1032. The electronic component 1022 is mounted on the top surface of the substrate 1010, and the bottom encapsulant 1032 is disposed on the top surface of the substrate 1010 and encapsulates the electronic component 1022. The substrate 1010, the electronic component 1022 and the bottom encapsulant 1032 are similar as the substrate 110, the electronic component 122 and the bottom encapsulant 132 shown in FIG. 1, respectively, and will not be described in detail herein. As shown in FIG. 10A, a plurality of electronic components 1022 can be formed on the substrate 1010. The plurality of electronic components 1022 can be isolated from each other by singulation channels (not shown), and the singulation channels can provide cutting areas to singulate the substrate 1010 into individual semiconductor devices.

As shown in FIG. 10B, a portion of a thickness of the bottom encapsulant 1032 is removed. For example, a portion of the bottom encapsulant 1032 is removed by a grinder 1072, so as to reduce a height of the semiconductor device to be formed. The grinder 1072 can also planarize the top surface of the bottom encapsulant 1032. It can be understood that the removing step may be omitted in some examples.

Figures 10C, 10D:
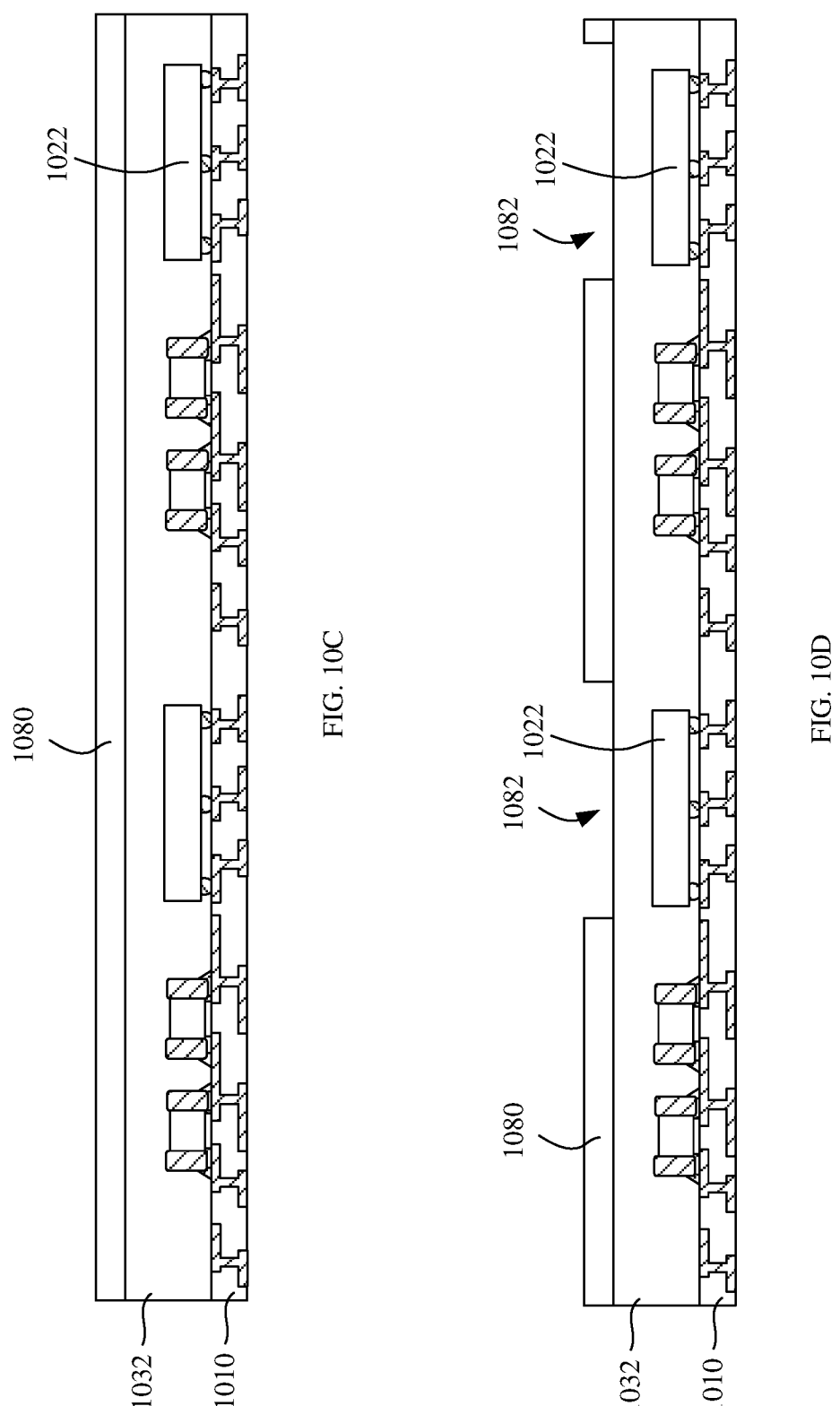

Afterwards, as shown in FIG. 10C, a mask 1080 is formed on the bottom encapsulant 1032.

The mask 1080 may include adhesive to provide a mechanical attachment of the mask 1080 to the bottom encapsulant 1032. For example, the mask 1080 may be a PI tape, a UV tape, a PET tape, or any suitable insulating, passivation, or photoresist layer deposited by any appropriate thin film deposition technique.

Afterwards, as shown in FIG. 10D, an opening 1082 is formed in the mask 1080 to expose the bottom encapsulant 1032. The opening 1082 is at a location above the electronic component 1022.

In some embodiments, a laser ablation process may be employed to form the opening 1082 in the mask 1080. In some other embodiments, the opening 1082 may be formed by an etching process, or any other process known in the art so long as the mask material can be removed.

Figures 10E, 10F:
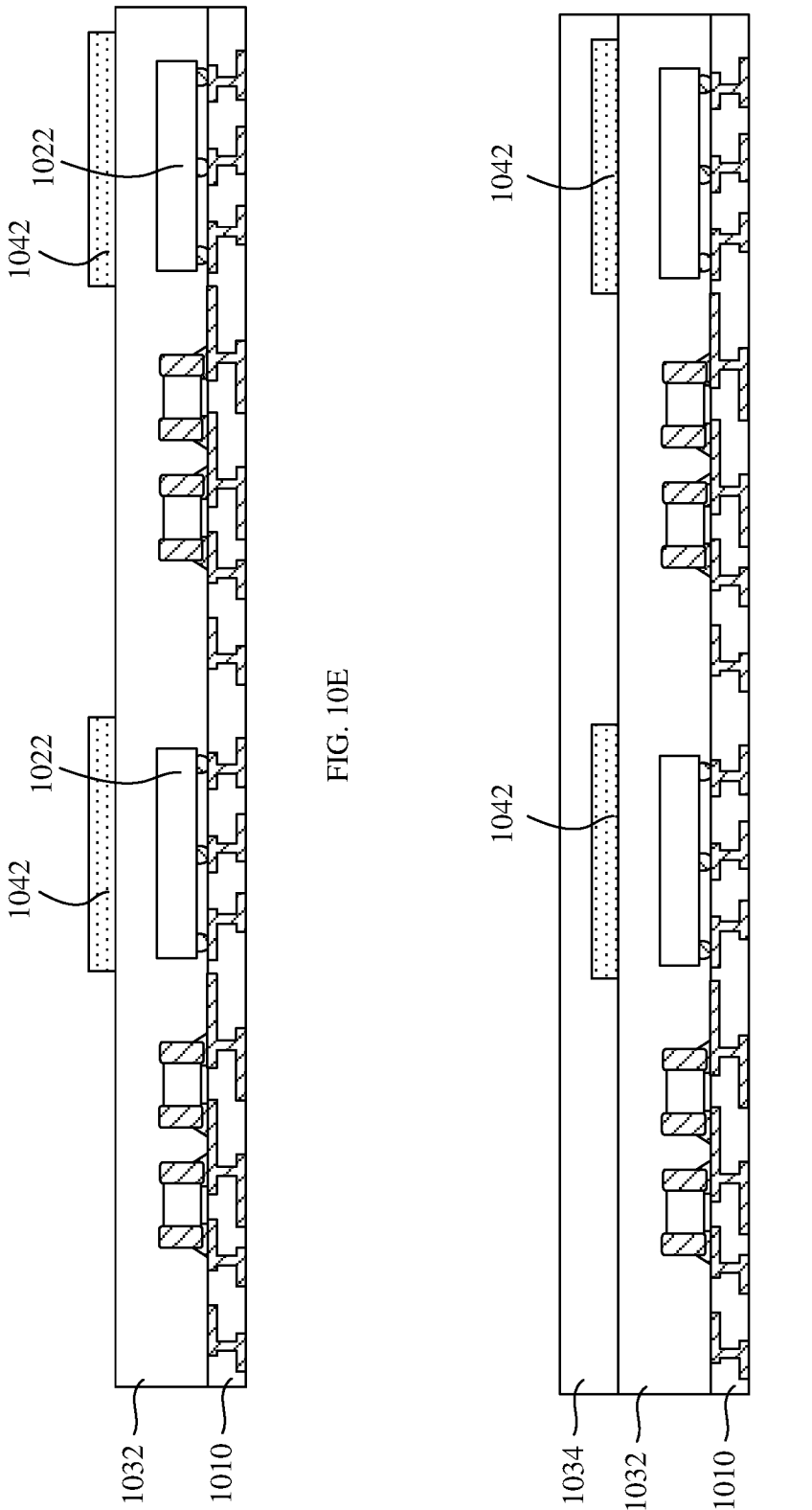

Afterwards, as shown in FIG. 10E, the internal shielding layer 1042 is formed on the bottom encapsulant 1032.

For example, referring to FIGS. 10D and 10E, a shielding material may be formed on the mask 1080 and in the opening 1082 by spray coating, plating, sputtering, or any other suitable metal deposition process. Then, the mask 1080 and the shielding material thereon are removed from the bottom encapsulant 1032. The shielding material remaining in the opening 1082 may form the internal shielding layer 1042.

Afterwards, as shown in FIG. 10F, a top encapsulant 1034 is formed on the bottom encapsulant 1302 and the internal shielding layer 1042.

For example, the top encapsulant 1034 can be formed on the bottom encapsulant 1032 and the internal shielding layer 1042 using a paste printing, compressive molding, transfer molding, liquid encapsulant molding, vacuum lamination, spin coating, or other suitable process. The top encapsulant 1034 may be made of polymer composite material, such as epoxy resin with filler, epoxy acrylate with filler, or polymer with proper filler, but the scope of this application is not limited thereto. In some embodiments, the top encapsulant 1034 may include an epoxy molding compound filled with one or more high-k dielectric materials. The high-k fillers can improve thermal conductivity of the top encapsulant 1034.

Figure 10G:
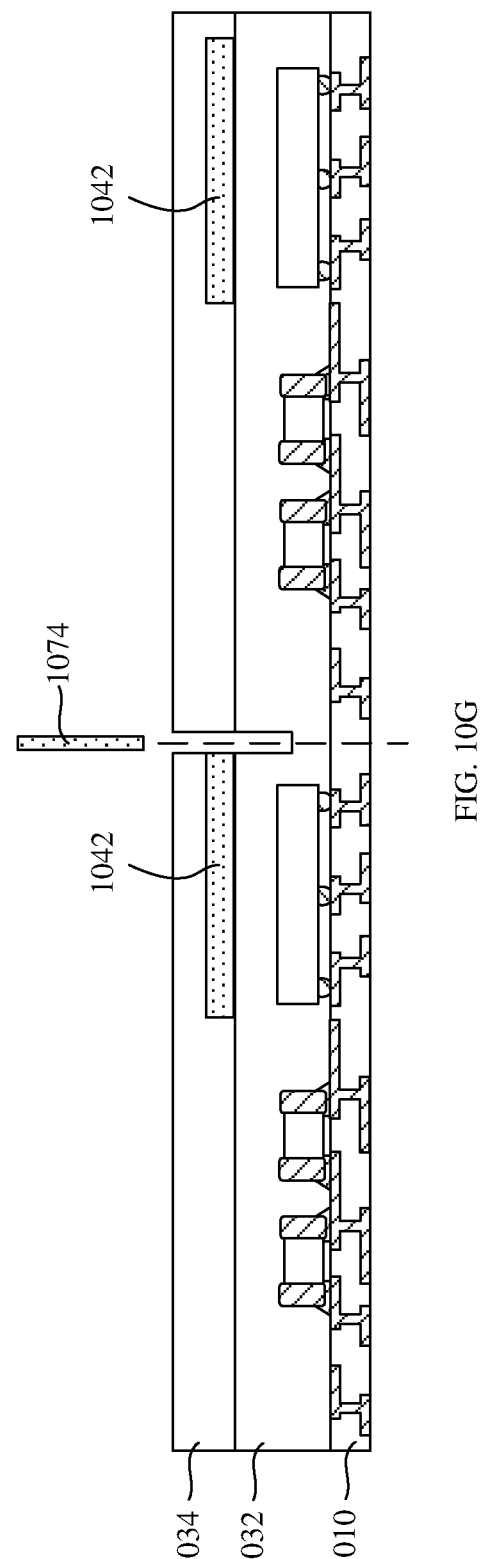

Afterwards, as shown in FIG. 10G, the substrate 1010 is singulated into individual devices, and a portion of a lateral surface of the internal shielding layer 1042 is exposed from the bottom encapsulant 1032 and the top encapsulant 1034.

For example, as shown in FIG. 10G, the substrate 1010 can be singulated into individual devices through singulation channels using a saw blade 1074. In some other examples, a laser cutting tool can also be used to singulate the substrate 1010.

Figure 10H:
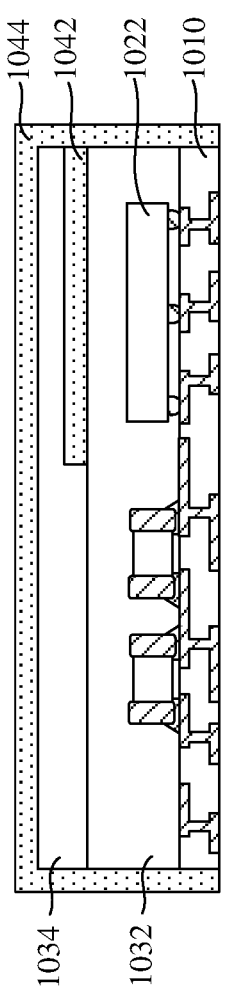

At last, as shown in FIG. 10H, an external shielding layer 1044 is formed to cover the bottom encapsulant 1032 and the top encapsulant 1034 and is in contact with the internal shielding layer 1042.

The external shielding layer 1044 may be made of the same material or a different material as the internal shielding layer 1042, and may be formed by spray coating, plating, sputtering, or any other suitable metal deposition process. The external shielding layer 1044 may be a conformal shield that follows the shapes and/or contours of the top encapsulant 1034, the bottom encapsulant 1032 and the substrate 1010. For example, the external shielding layer 1044 covers the top and lateral surfaces of the top encapsulant 1034, the lateral surface of the bottom encapsulant 1032, and the lateral surface of the substrate 1010. As a portion of the lateral surface of the internal shielding layer 1042 is exposed from the bottom encapsulant 1032 and the top encapsulant 1034, the external shielding layer 1044 may also be in contact with the internal shielding layer 1042.

Referring to FIGS. 11A-11D, cross-sectional views illustrating a method of making a semiconductor device are shown. For example, the method can also be used to make the semiconductor device shown in FIG. 8.

Figures 11A, 11B:
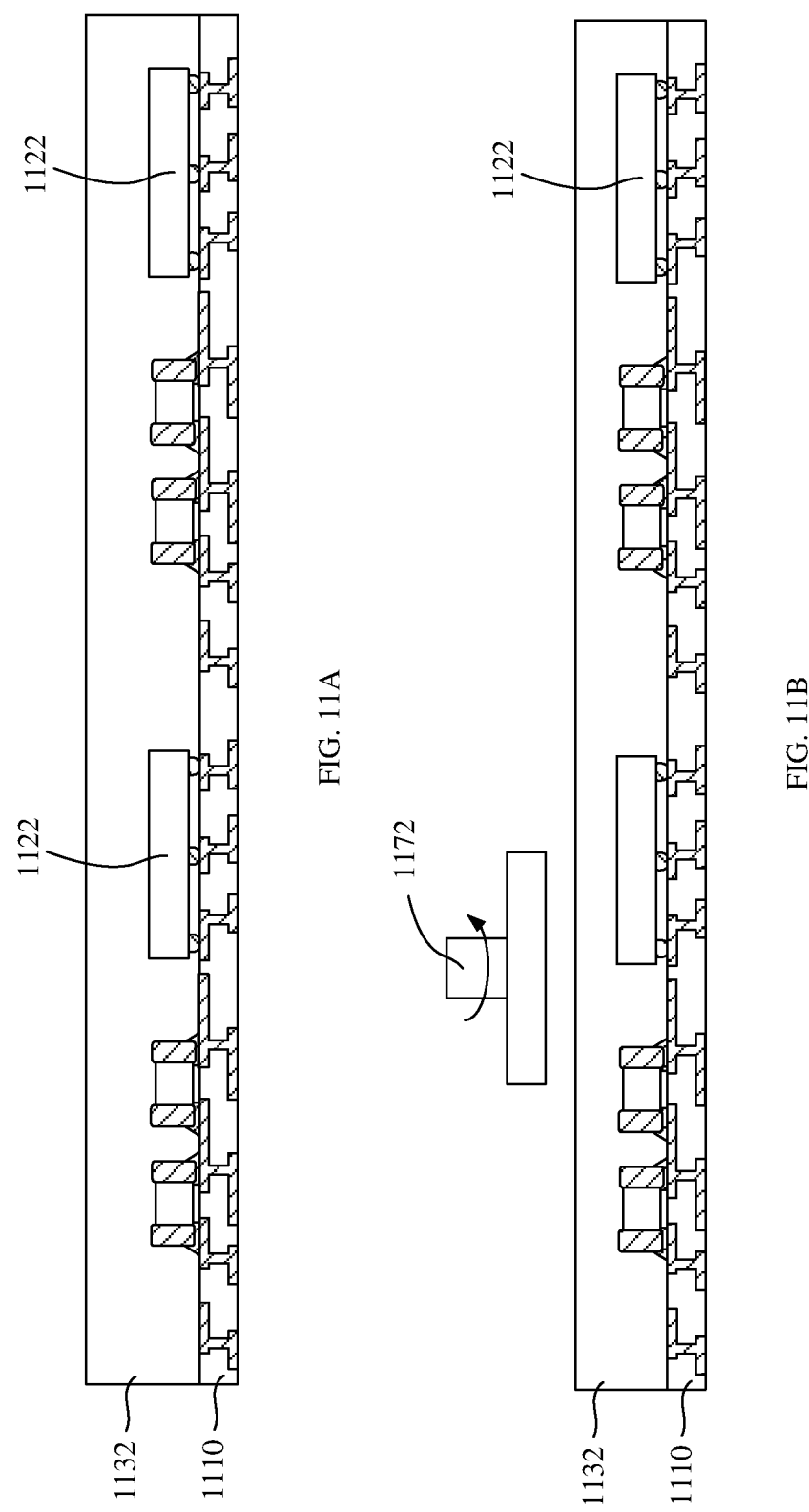
FIGS. 11A to 11D are cross-sectional views illustrating various steps of a method for making a semiconductor device according to another embodiment of the present application.

As shown in FIG. 11A, a package is provided. The package includes a substrate 1110, an electronic component 1122, and a bottom encapsulant 1132. The electronic component 1122 is mounted on the top surface of the substrate 1110, and the bottom encapsulant 1132 is disposed on the top surface of the substrate 1110 and encapsulating the electronic component 1122.

As shown in FIG. 11B, a portion of a thickness of the bottom encapsulant 1132 is removed. For example, a portion of the bottom encapsulant 1132 is removed by a grinder 1172, so as to reduce a height of the semiconductor device to be formed. The grinder 1172 can also planarize the top surface of the bottom encapsulant 1132. It can be understood that the removing step may be omitted in some examples.

Figures 11C, 11D:
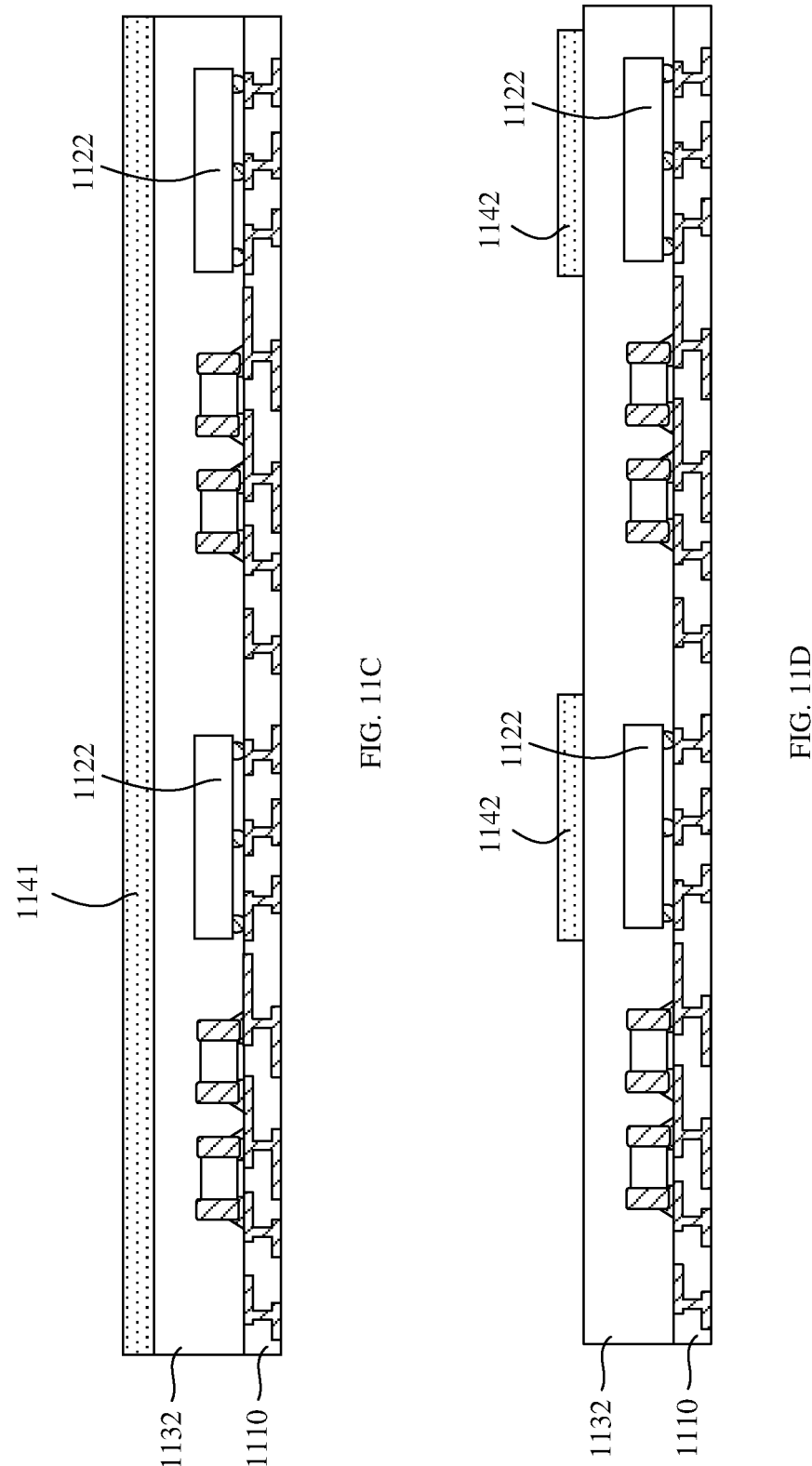

As shown in FIG. 11C, a shielding material 1141 is formed on the bottom encapsulant 1132. For example, the shielding material 1141 may be formed by spray coating, plating, sputtering, or any other suitable metal deposition process. The shielding material 1141 may be formed from copper, aluminum, iron, or any other suitable material for EMI shielding.

Referring to FIG. 11C and FIG. 11D, the shielding material 1141 outside an area above the electronic component 1122 is removed. Thus, the remaining shielding material 1141 in the area above the electronic component 1122 forms the internal shielding layer 1142.

In some embodiments, a laser ablation process may be employed to remove a portion of the shielding material 1141 on the bottom encapsulant 1132. The laser ablation process can be controlled by CAD data, and therefore the size and the location of the internal shielding layer 1142 can be accurate. In some embodiments, an etching process (for example, a dry etching process or a chemical etching process) may be employed to remove the portion of the shielding material 1141. It could be understood that any other process capable of removing the shielding material 1141 can be employed in the present application.

The structure shown in FIG. 11D is similar to the structure shown in FIG. 10E, and accordingly subsequent processes similar to FIG. 10F-10H may be performed on the structure shown in FIG. 11D to form the semiconductor device of the present application, and will not be elaborated herein.

Figure 12:
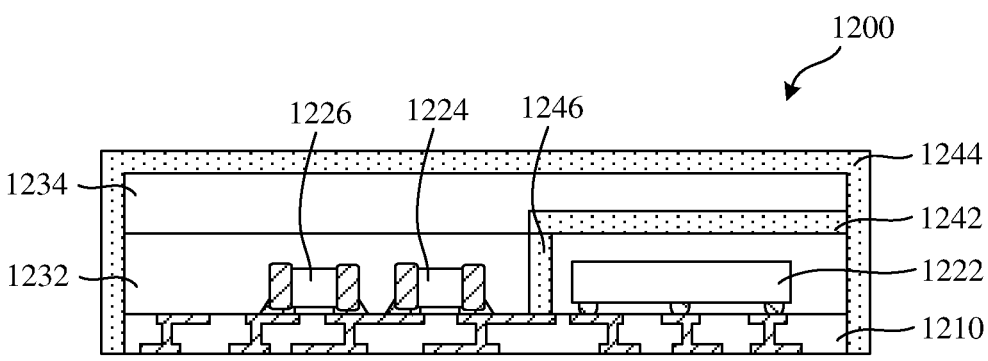
FIG. 12 is a cross-sectional view of a semiconductor device according to another embodiment of the present application.

FIG. 12 illustrates a cross-sectional view of another semiconductor device 1200 according to another embodiment of the present application.

As shown in FIG. 12, the semiconductor device 1200 includes a substrate 1210, an electronic component 1222, a bottom encapsulant 1232, a top encapsulant 1234, an internal shielding layer 1242 and an external shielding layer 1244. The electronic component 1222 is mounted on the top surface of the substrate 1210, the bottom encapsulant 1232 is disposed on the top surface of the substrate 1210 and encapsulates the electronic component 1222, and the top encapsulant 1234 is disposed on the bottom encapsulant 1232. The internal shielding layer 1242 is disposed between the bottom encapsulant 1232 and the top encapsulant 1234, and a projection of the internal shielding layer 1242 onto the top surface of the substrate 1210 overlaps with the electronic component 1222. As shown in FIG. 12, the bottom surface of the top encapsulant 1234 includes a concave portion, and the internal shielding layer 1242 is disposed in the concave portion of the bottom surface of the top encapsulant 1234. A portion of the lateral surface of the internal shielding layer 1242 is exposed from the bottom encapsulant 1232 and the top encapsulant 1234. The external shielding layer 1244 covers the bottom encapsulant 1232 and the top encapsulant 1234 and is in contact with the portion of the lateral surface of the internal shielding layer 1242.

Referring to FIG. 12, the semiconductor device 1200 further includes a conductive fence 1246. The conductive fence 1246 is disposed on the top surface of the substrate 1210 and is in contact with the internal shielding layer 1242.

For example, the conductive fence 1246 may be bonded to a conductive layer on the substrate 1210 with a conductive paste. The conductive fence 1246 can be one or more layers of Al, Cu, Sn, Ni, Au, Ag, or other suitable conductive material. Alternatively, the conductive fence 1246 can be carbonyl iron, stainless steel, nickel silver, low-carbon steel, silicon-iron steel, foil, conductive resin, carbon-black, aluminum flake, or other metals and composites capable of reducing the effects of EMI, RFI, and other inter-device interference. The conductive fence 1246 may extend above the substrate 1210 and provide physical and electrical isolation between the electronic component 1222 and other electronic components (for example, electronic components 1224 and 1226 shown in FIG. 12). The conductive fence 1246 can further shield EMI or other interferences induced to (or generated by) the electronic component 1222.

Figures 13A, 13B:
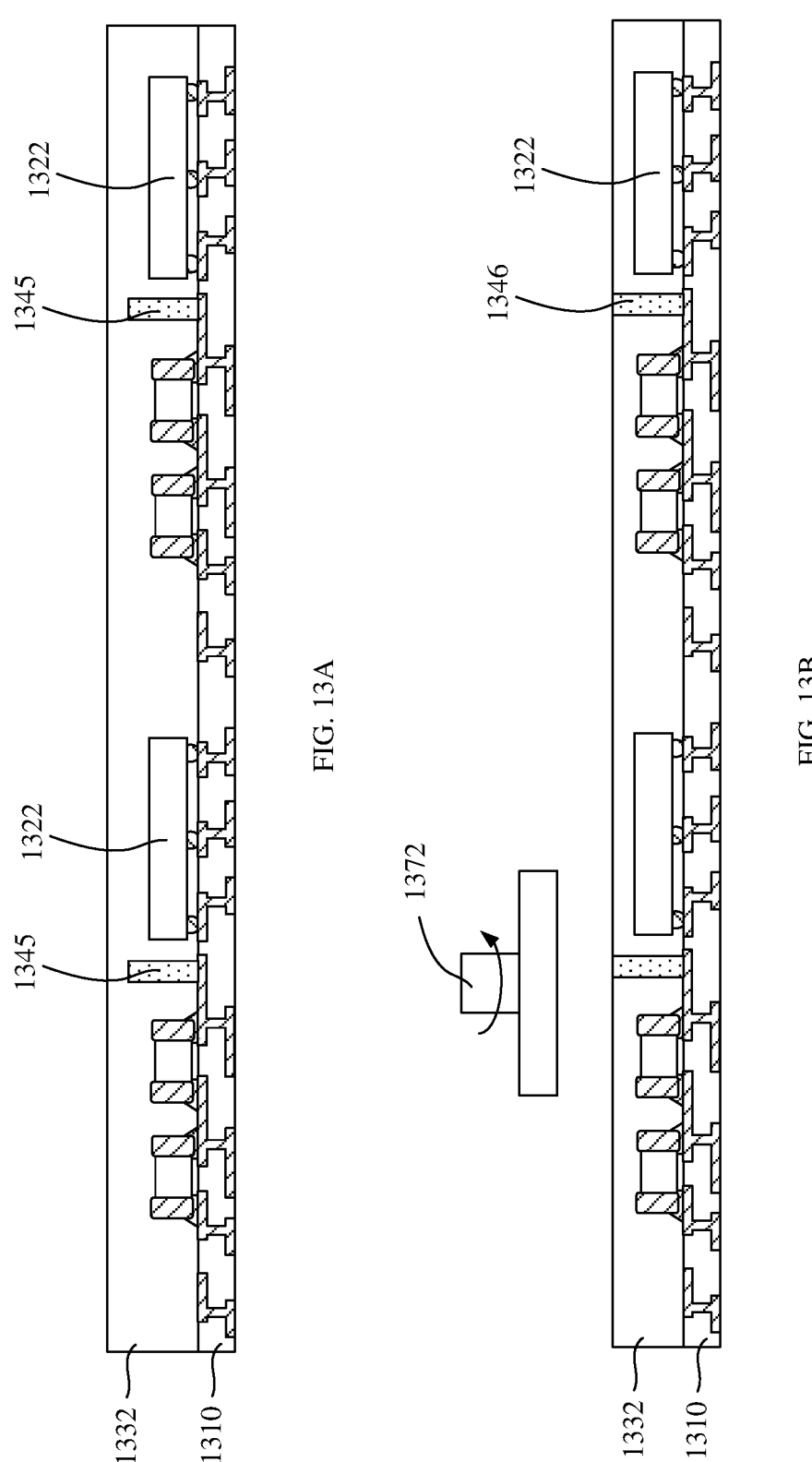
FIGS. 13A to 13B are cross-sectional views illustrating various steps of a method for making a semiconductor device according to another embodiment of the present application.

Referring to FIGS. 13A-13B, cross-sectional views illustrating a method of making a semiconductor device are shown. For example, the method can also be used to make the semiconductor device shown in FIG. 12.

As shown in FIG. 13A, a package is provided. The package includes a substrate 1310, an electronic component 1322, and a bottom encapsulant 1332. The electronic component 1322 is mounted on the top surface of the substrate 1310, and the bottom encapsulant 1332 is disposed on the top surface of the substrate 1310 and encapsulates the electronic component 1322. Referring to FIG. 13A, the package further includes a metal wall 1345. The metal wall 1345 can be bonded to a conductive layer on the substrate 1310 with a conductive paste.

Afterwards, as shown in FIG. 13B, a portion of a thickness of the bottom encapsulant 1332 is removed. For example, a portion of the bottom encapsulant 1332 is removed by a grinder 1372, so as to reduce a height of the semiconductor device to be formed. The grinder 1372 can also planarize the top surface of the bottom encapsulant 1332. In some embodiments, after the removing process, a top surface of the metal wall 1345 is exposed from the bottom encapsulant 1332. In some embodiments, a portion of the metal wall 1345 is also removed in the removing process, and the metal wall 1345 left in the bottom encapsulant 1332 forms the conductive fence 1346.

The structure shown in FIG. 13B is similar to the structure shown in FIG. 10B, and accordingly subsequent processes similar to FIG. 10C-10H may be performed on the structure shown in FIG. 13B, and will not be elaborated herein.

Figures 14A, 14B:
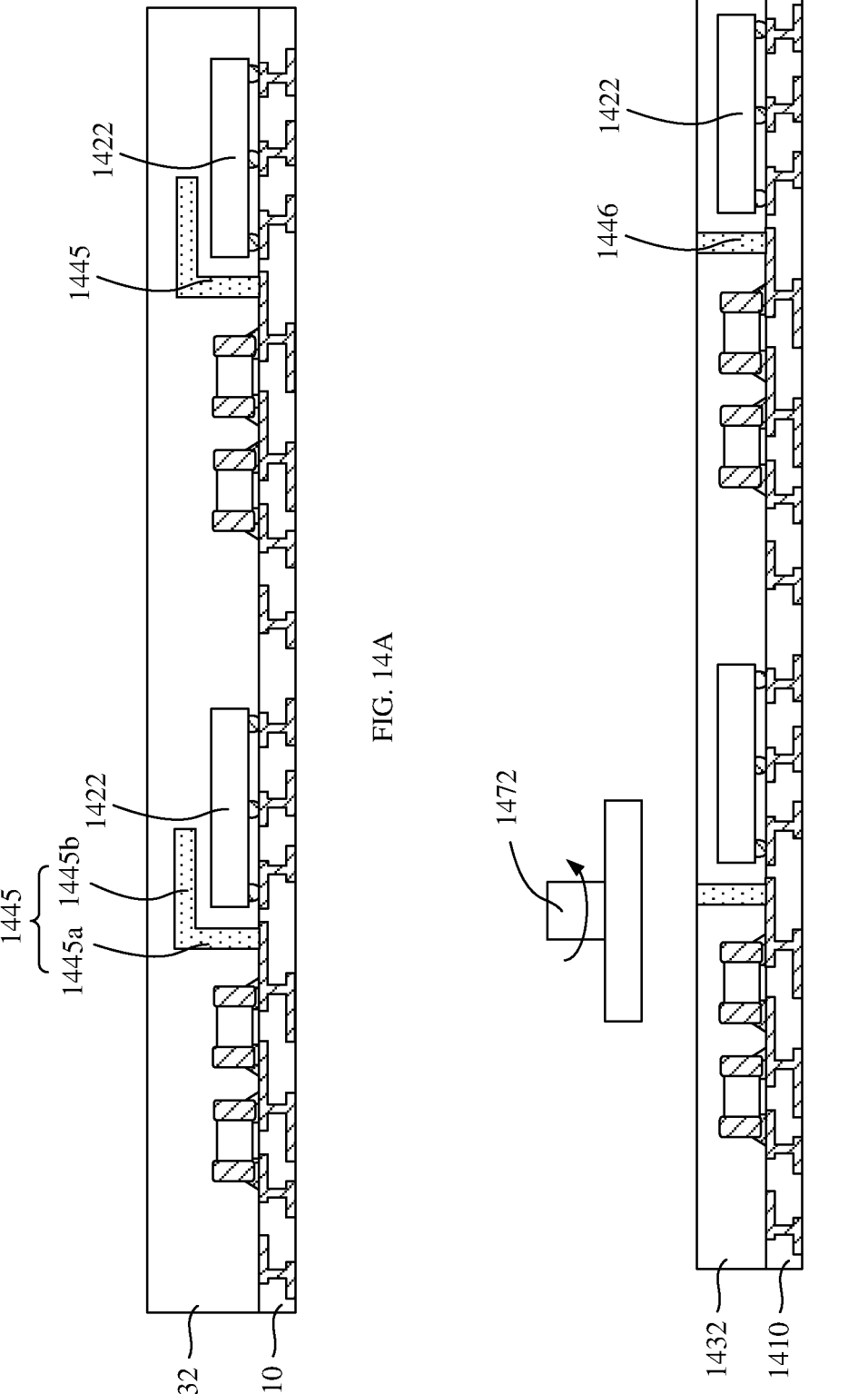
FIGS. 14A to 14B are cross-sectional views illustrating various steps of a method for making a semiconductor device according to another embodiment of the present application.

Referring to FIGS. 14A-14B, cross-sectional views illustrating a method of making a semiconductor device are shown. For example, the method can also be used to make the semiconductor device shown in FIG. 12.

As shown in FIG. 14A, a package is provided. The package includes a substrate 1410, an electronic component 1422, and a bottom encapsulant 1432. The electronic component 1422 is mounted on the top surface of the substrate 1410, and the bottom encapsulant 1432 is disposed on the top surface of the substrate 1410 and encapsulates the electronic component 1422. Referring to FIG. 14A, the package further includes a metal can 1445. The metal can 1445 may include a vertical portion 1445*a* and a horizontal portion 1445*b*. The metal can 1445 may be a metal sheet that are pre-formed with a desired shape and then connected to the substrate 1410 with solder or some other mechanism.

Afterwards, as shown in FIG. 14B, a portion of a thickness of the bottom encapsulant 1432 is removed.

For example, a grinder 1472 may be used to reduce a height of the bottom encapsulant 1432. For example, the grinder 1472 can remove a portion of the bottom encapsulant 1432, the horizontal portion 1445*b* of the metal can 1445, and a portion of the vertical portion 1445*a* of the metal can 1445. The remaining portion of the vertical portion 1445*a* of the metal can 1445 forms the conductive fence 1446.

The structure shown in FIG. 14B is similar to the structure shown in FIG. 10B, and accordingly subsequent processes similar to FIG. 10C-10H may be performed on the structure shown in FIG. 14B, and will not be elaborated herein.

While the process for making the semiconductor device is illustrated in conjunction with FIGS. 3A-4G, FIGS. 4A-4D, FIGS. 6A-6B, FIGS. 7A-7B, FIGS. 10A-10H, FIGS. 11A-11D, FIGS. 13A-13B, and FIGS. 14A-14B, it will be understood by those skilled in the art that modifications and adaptations to the process may be made without departing from the scope of the present invention.

The discussion herein included numerous illustrative figures that showed various portions of a semiconductor device and a method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A semiconductor device, comprising:
   a substrate comprising a substrate top surface and a substrate bottom surface;
   an electronic component mounted on the substrate top surface;
   a bottom encapsulant disposed on the substrate top surface and encapsulating the electronic component;
   a top encapsulant disposed on the bottom encapsulant;
   an internal shielding layer disposed between the bottom encapsulant and the top encapsulant, wherein a projection of the internal shielding layer onto the substrate top surface covers the electronic component, the internal shielding layer has an internal shielding layer lateral surface, and a portion of the internal shielding layer lateral surface is exposed from the bottom encapsulant and the top encapsulant; and
   an external shielding layer covering the bottom encapsulant and the top encapsulant and in contact with the exposed portion of the internal shielding layer lateral surface,
   wherein the bottom encapsulant comprises a bottom encapsulant top surface and a bottom encapsulant bottom surface, the bottom encapsulant top surface comprises a concave portion, and the internal shielding layer is disposed in the concave portion of the bottom encapsulant top surface.

2. The semiconductor device of claim 1, further comprising:
   a conductive fence disposed on the substrate top surface and contacting with the internal shielding layer.

3. The semiconductor device of claim 1, wherein the electronic component is configured to provide a radio frequency front end (RFFE) functionality.

4. The semiconductor device of claim 1, wherein the top encapsulant comprises an epoxy molding compound filled with one or more high-k dielectric materials.

5. A method for making a semiconductor device, comprising:

providing a package comprising:

a substrate comprising a substrate top surface and a substrate bottom surface;

an electronic component mounted on the substrate top surface; and a bottom encapsulant disposed on the substrate top surface and encapsulating the electronic component;

forming an internal shielding layer on the bottom encapsulant, wherein a projection of the internal shielding layer onto the substrate top surface covers the electronic component;

forming a top encapsulant on the bottom encapsulant and the internal shielding layer;

exposing a portion of a lateral surface of the internal shielding layer from the bottom encapsulant and the top encapsulant; and forming an external shielding layer to cover the bottom encapsulant and the top encapsulant and be in contact with the exposed portion of the lateral surface of the internal shielding layer, wherein forming the internal shielding layer on the bottom encapsulant comprises:

forming a mask on the bottom encapsulant;

forming an opening in the mask to expose the bottom encapsulant, wherein the opening is at a location above the electronic component; and forming the internal shielding layer in the opening of the mask.

6. The method of claim 5, wherein forming the internal shielding layer in the opening of the mask comprises:

depositing a shielding material on the mask and in the opening; and removing the mask and the shielding material outside the opening.

7. The method of claim 5, wherein forming the internal shielding layer on the bottom encapsulant comprises:

forming a shielding material on the bottom encapsulant; and removing the shielding material outside a predetermined area, wherein the predetermined area is at a location above the electronic component.

8. The method of claim 5, wherein the package further comprises a conductive fence disposed on the substrate top surface, and the internal shielding layer contacts with the conductive fence.

9. The method of claim 5, wherein exposing the portion of the lateral surface of the internal shielding layer comprises:

singulating the substrate into individual devices to exposing the portion of the lateral surface of the internal shielding layer.

\*   \*   \*   \*   \*